(12) United States Patent
Carman et al.

(10) Patent No.: US 8,446,794 B2
(45) Date of Patent: *May 21, 2013

(54) REFRESHING DATA OF MEMORY CELLS WITH ELECTRICALLY FLOATING BODY TRANSISTORS

(75) Inventors: Eric Carman, Cernex (FR); Mikhail Nagoga, Pully (CH); Serguei Okhonin, Lausanne (CH)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/479,065

(22) Filed: May 23, 2012

(65) Prior Publication Data
US 2012/0236671 A1   Sep. 20, 2012

Related U.S. Application Data

(63) Continuation of application No. 12/212,326, filed on Sep. 17, 2008, now Pat. No. 8,194,487.

(60) Provisional application No. 60/973,139, filed on Sep. 17, 2007.

(51) Int. Cl.
*G11C 7/00*   (2006.01)

(52) U.S. Cl.
USPC ............ 365/222; 365/177; 365/191; 365/205

(58) Field of Classification Search
USPC .................................. 365/177, 191, 205, 222
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |

(Continued)

FOREIGN PATENT DOCUMENTS

| CA | 272437 | 7/1927 |
|---|---|---|
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Hoai V Ho
(74) *Attorney, Agent, or Firm* — Wilmer Cutler Pickering Hale and Dorr LLP

(57) ABSTRACT

A semiconductor device along with circuits including the same and methods of operating the same are described. The device comprises a memory cell including one transistor. The transistor comprises a gate, an electrically floating body region, and a source region and a drain region adjacent the body region. Data stored in memory cells of the device can be refreshed within a single clock cycle.

34 Claims, 15 Drawing Sheets

U.S. PATENT DOCUMENTS

| | | | |
|---|---|---|---|
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrent et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |

| | | |
|---|---|---|
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 8,194,487 B2 * | 6/2012 | Carman et al. ............... 365/222 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |

| | | |
|---|---|---|
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-kMetal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Ban et al., Integration of Back-Gate Doping for 15-nm Node Floating Body Cell (FBC) Memory, Components Research, Process Technology Modeling, presented in the 2010 VLSI Symposium on Jun. 17, 2010.
Bawedin, Maryline, et al., A Capacitorless 1T DRAM on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. on El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, Same.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-RAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (DRAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. on El. Dev.
Kwon et al., "A Highly Scalable 4F2 DRAM Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. on El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology(CMOS IV) for 128Mb SOI DRAM, 2005, IEDM.
Mohapatra et al., Effect of Source/Drain Asymmetry on the Performance of Z-RAMÒ Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying of Hot Carrier Effect in Floating Body SOI MOSFETs by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562 µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., IT-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less DRAM Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. on El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. on El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si—SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

International Search Report mailed Nov. 19, 2008 for International Patent Application No. PCT/US08/76666.

* cited by examiner

REFRESHING DATA OF MEMORY CELLS WITH ELECTRICALLY FLOATING BODY TRANSISTORS

RELATED APPLICATIONS

This patent application is a continuation of U.S. patent application Ser. No. 12/212,326, filed Sep. 17, 2008, now U.S. Pat. No. 8,194,487, which claims the benefit of U.S. Provisional Patent Application No. 60/973,139, filed Sep. 17, 2007.

TECHNICAL FIELD

The embodiments relate to a semiconductor device, architecture, memory cell, array, and techniques for controlling and/or operating such device, cell, and array. More particularly, in one aspect, the embodiments relate to a dynamic random access memory ("DRAM") cell, array, architecture and device, wherein the memory cell includes an electrically floating body configured or operated to store an electrical charge.

BACKGROUND

There is a continuing trend to employ and/or fabricate advanced integrated circuits using techniques, materials and devices that improve performance, reduce leakage current and enhance overall scaling. Semiconductor-on-Insulator (SOI) is a material in which such devices may be fabricated or disposed on or in (hereinafter collectively "on"). Such devices are known as SOI devices and include, for example, partially depleted (PD) devices, fully depleted (FD) devices, multiple gate devices (for example, double or triple gate), and Fin-FET.

One type of dynamic random access memory cell is based on, among other things, the electrically floating body effect of SOI transistors; see, for example, U.S. Pat. No. 6,969,662 (the '662 patent). In this regard, the dynamic random access memory cell may consist of a PD or a FD SOI transistor (or transistor formed in bulk material/substrate) having a channel, which is disposed adjacent to the body and separated from the channel by a gate dielectric. The body region of the transistor is electrically floating in view of the insulation layer (or non-conductive region, for example, in a bulk-type material/substrate) disposed beneath the body region. The state of the memory cell is determined by the concentration of charge within the body region of the SOI transistor.

Data is written into or read from a selected memory cell by applying suitable control signals to a selected word line(s), a selected source line(s) and/or a selected bit line(s). In response, charge carriers are accumulated in or emitted and/or ejected from electrically floating body region wherein the data states are defined by the amount of carriers within electrically floating body region. Notably, the entire contents of the '662 patent, including, for example, the features, attributes, architectures, configurations, materials, techniques and advantages described and illustrated therein, are incorporated by reference herein.

Referring to the operations of an N-channel transistor, for example, the memory cell of a DRAM array operates by accumulating in or emitting/ejecting majority carriers (electrons or holes) from body region. In this regard, conventional write techniques may accumulate majority carriers (in this example, "holes") in body region of memory cells by, for example, impact ionization near source region and/or drain region. In sum, conventional writing programming techniques for memory cells having an N-channel type transistor often provide an excess of majority carriers by impact ionization or by band-to-band tunneling (gate-induced drain leakage ("GIDL")). The majority carriers may be emitted or ejected from body region by, for example, forward biasing the source/body junction and/or the drain/body junction, such that the majority carrier may be removed via drain side hole removal, source side hole removal, or drain and source hole removal, for example.

Notably, for at least the purposes of this discussion, a logic high data state, or logic "1", corresponds to, for example, an increased concentration of majority carriers in the body region relative to an unprogrammed device and/or a device that is programmed with logic low data state, or logic "0". In contrast, a logic low data state, or logic "0", corresponds to, for example, a reduced concentration of majority carriers in the body region relative to a device that is programmed with a logic high data state, or logic "1". The terms "logic low data state" and "logic 0" may be used interchangeably herein; likewise, the terms "logic high data state" and "logic 1" may be used interchangeably herein.

In one conventional technique, the memory cell is read by applying a small bias to the drain of the transistor as well as a gate bias which is above the threshold voltage of the transistor. In this regard, in the context of memory cells employing N-type transistors, a positive voltage is applied to one or more word lines to enable the reading of the memory cells associated with such word lines. The amount of drain current is determined or affected by the charge stored in the electrically floating body region of the transistor. As such, conventional reading techniques sense the amount of channel current provided/generated in response to the application of a predetermined voltage on the gate of the transistor of the memory cell to determine the state of the memory cell; a floating body memory cell may have two or more different current states corresponding to two or more different logical states (for example, two different current conditions/states corresponding to the two different logical states: "1" and "0").

Further to writing and reading data to memory cells, data stored in the memory cells is required, under certain circumstances, to be periodically refreshed as a result of leakage current. The refreshing of the memory generally involves periodically reading information or data from an area of the memory (e.g., memory cells), and subsequently rewriting the read information into the same area of memory (e.g., memory cells) from which it was read with no modifications. Conventional refreshing techniques thus use the read and write operations appropriate to the transistor, and perform the read and write during two or more separate clock cycles. The technique used for refreshing data in a dynamic memory can have a large impact on memory performance, including memory availability, die area, and power consumption. Memories are typically and more specifically refreshed by performing a read operation during which data is read from memory cells into sense amps, followed by a write operation during which data is written back into the memory cells.

Conventional solutions to improve memory availability have typically involved increasing the number of sense amps in the memory so more of the memory can be refreshed at the same time. Unfortunately, the addition of more sense amps increases memory die area. Additionally, conventional refresh techniques often lead to relatively large power consumption due to, for example, the separate read and write operations of the refresh. The present inventions, in one aspect, are directed to allowing the refreshing of memory cells in a single cycle.

INCORPORATION BY REFERENCE

Each patent, patent application, and/or publication mentioned in this specification is herein incorporated by reference in its entirety to the same extent as if each individual patent, patent application, and/or publication was specifically and individually indicated to be incorporated by reference.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, materials and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

DETAILED DESCRIPTION

There are many inventions described herein as well as many aspects and embodiments of those inventions. In one aspect, the present inventions are directed to a semiconductor device including an electrically floating body. "Electrically floating body" or "floating body" refers to a transistor body which is not coupled to, and is therefore insulated from, power or ground rails within a semiconductor device or integrated circuit (IC) chip. Various levels of charge may therefore accumulate within a floating body of a transistor. Floating-body transistors are a significant characteristic of SOI devices.

In another aspect, the present inventions are directed to techniques to control and/or operate a semiconductor memory cell (and memory cell array having a plurality of such memory cells as well as an integrated circuit device including a memory cell array) having one or more electrically floating body transistors in which an electrical charge is stored in the body region of the electrically floating body transistor. The techniques of the present inventions may employ intrinsic bipolar transistor currents (referred to herein as "source" currents) to control, write, read and/or refresh a data state in such a memory cell. In this regard, the present inventions may employ the intrinsic bipolar source current to control, write, read and/or refresh a data state in/of the electrically floating body transistor of the memory cell.

The present inventions are also directed to semiconductor memory cell, array, circuitry and device to implement such control and operation techniques. Notably, the memory cell and/or memory cell array may comprise a portion of an integrated circuit device, for example, logic device (such as, a microcontroller or microprocessor) or a portion of a memory device (such as, a discrete memory).

Figure 1A:
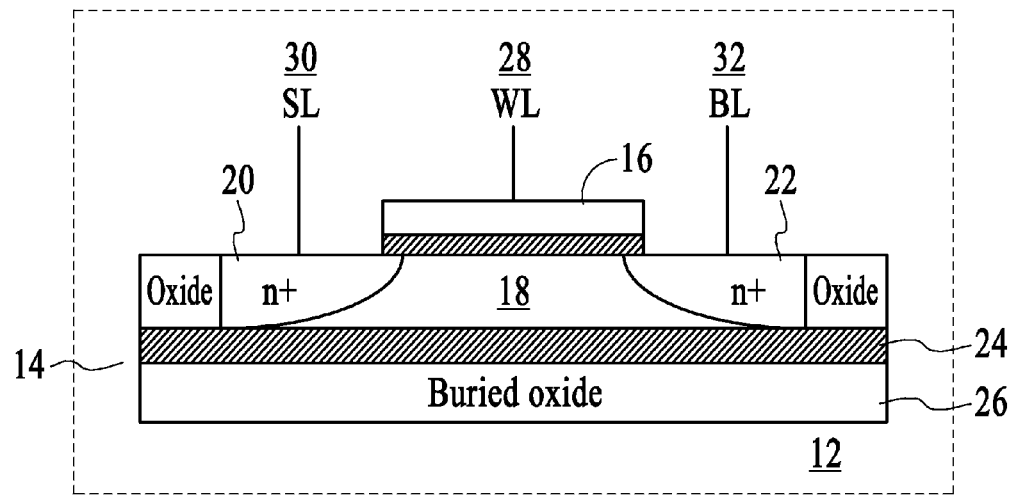
FIG. 1A is a memory cell configured for single-cycle refresh, under an embodiment.

FIG. 1A is a memory cell 12 configured for single-cycle refresh, under an embodiment. The refresh operations described herein are also referred to as "single-cycle refresh" operations. The memory cell 12 is configured at least nearly the same as or representative of numerous other memory cells of a memory array (not shown) to which the memory cell 12 may be coupled. The memory cell 12 includes a transistor 14 having gate 16, body region 18, which is configured to be electrically floating, source region 20 and drain region 22. The body region 18 is disposed between source region 20 and drain region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

Data is written into, read from, or refreshed in a selected memory cell 12 by applying suitable control signals to a selected word line(s) 28, a selected source line(s) 30 and/or a selected bit line(s) 32. For example, the gate 16 of a transistor 14 of an embodiment is coupled to a word line 28, the source region 20 is coupled to a source line 30, and the drain region 22 is coupled to a bit line 32. In response to the control signals, charge carriers are accumulated in or emitted and/or ejected from electrically floating body region 18 wherein the data states are defined by the amount of carriers within electrically floating body region 18.

Figure 1B:
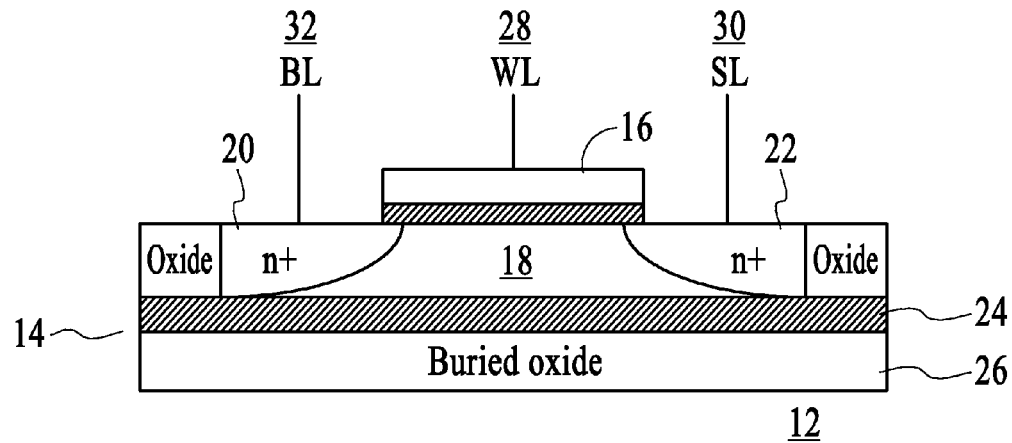
FIG. 1B is a memory cell configured for single-cycle refresh, under an alternative embodiment.

FIG. 1B is a memory cell 12 configured for single-cycle refresh, under an alternative embodiment. The memory cell 12 includes a transistor 14 having gate 16, body region 18, which is configured to be electrically floating, source region 20 and drain region 22. The body region 18 is disposed between drain region 20 and source region 22. Moreover, body region 18 is disposed on or above region 24, which may be an insulation region (for example, in an SOI material/substrate) or non-conductive region (for example, in a bulk-type material/substrate). The insulation or non-conductive region 24 may be disposed on substrate 26.

The description herein describes write, read and refresh operations corresponding to the floating-body transistors provided herein. It is understood that the write and read operations described herein are components of refresh operations, so any description herein of write and/or read operations includes write and/or read operations that are components of the refresh operations provided herein.

Data is written into, read from, or refreshed in a selected memory cell 12 by applying suitable control signals to a selected word line(s) 28, a selected source line(s) 30 and/or a selected bit line(s) 32. For example for FIG. 1B, the gate 16 of a transistor 14 of an embodiment is coupled to a word line 28, the drain region 20 is coupled to a bit line 32, and the source region 22 is coupled to a source line 30. In response to the control signals, charge carriers are accumulated in or emitted and/or ejected from electrically floating body region 18 wherein the data states are defined by the amount of carriers within electrically floating body region 18.

The memory cell 12 of an embodiment generally operates by accumulating in or emitting/ejecting majority carriers (electrons or holes) from body region 18. In this regard, write operations or techniques may accumulate majority carriers (e.g., "holes") in body region 18 of memory cell transistors by, for example, impact ionization near drain region 20 and/or source region 22, as described in detail herein. During read operations, the majority carriers may be emitted or ejected from body region 18 by, for example, forward biasing the source/body junction and/or the drain/body junction as described in detail herein.

Writing data into a selected memory cell 12 of an embodiment includes applying suitable control signals to a selected word line(s) 28, a selected source line(s) 30 and/or a selected bit line(s) 32, as described in detail herein. As a result of the body region 18 being electrically insulated from the underlying substrate 26 by an insulating layer 24, the control signals result in data being written to the transistor in the form of charge stored in the body region 18. The stored charge may be referred to as "body charge" but is not so limited.

The configuration of the memory cell 12 described herein, which consists essentially of one transistor, is in contrast to body-contacted dynamic random access memory (BCDRAM) cells that include multiple transistors per cell. For example, each BCDRAM cell includes, in addition to a storage transistor, one or more access transistors contacted to a contact of the body region of the storage transistor. The numerous transistors included in the configuration of a BCDRAM cell (an example of which is provided in U.S. Pat. No. 6,111,778) thus makes write and/or read operations different from those described herein for use in the operation of memory cell 12.

Data is read from a memory cell 12 of an embodiment by generally applying suitable control signals to a selected word line(s) 28, a selected source line(s) 30 and/or a selected bit line(s) 32 that cause the body-to-source junction (PN junction) to become forward biased or not depending on data state. This condition precipitates an inherent bipolar current. The total charge of the bipolar current has a magnitude proportional to the charge accumulated on the body region 18 of the transistor multiplied by the current gain (beta value) of the inherent bipolar transistor. The inherent bipolar current is a distorted pulse waveform of relatively short duration. In this manner the effective value of capacitance, in terms of the magnitude of discharge current sensed at a bit line (FIG. 1A-1B, element 32), is enhanced by this parasitic bipolar effect.

Figure 2:
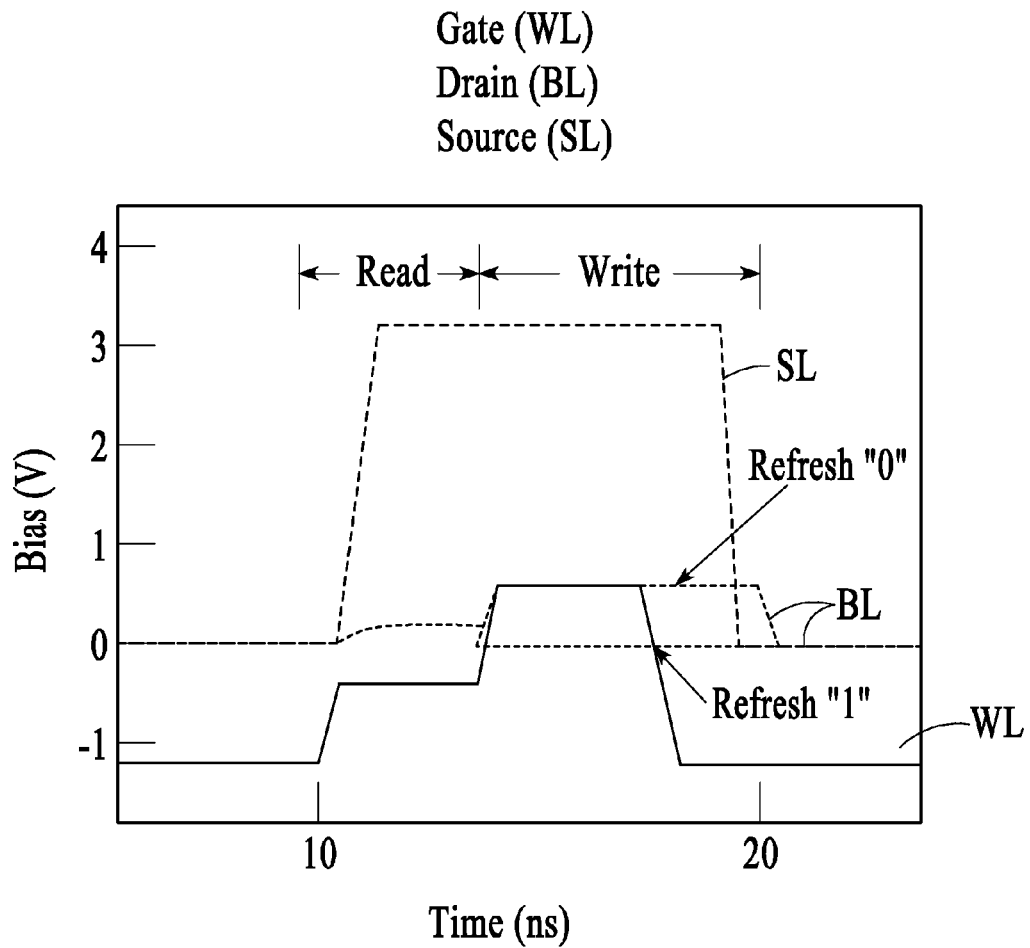
FIG. 2 shows relative magnitudes and timing of control signal application to a floating-body transistor during single-cycle refresh operations, under an embodiment.

FIG. 2 shows relative magnitudes and timing of control signal application to a floating-body transistor 14 during single-cycle refresh operations, under a first embodiment. The one- or single-cycle refresh of an embodiment reads data and writes back either a logic low or logic high data state (as appropriate to the data read) during a single clock cycle. The single-cycle refresh generally saves time and has relatively lower power consumption when compared to the conventional two-cycle refresh. The faster speed and lower power consumption result from the fact that the voltages applied to the source and gate of the transistor during the single-cycle are not returned to hold state values between the read and write operations.

During refresh operations, the floating-body transistor of a second embodiment has the characteristic that, when reading a memory cell previously written to the logic high data state (the body of the memory cell transistor is positively charged), current flows from collector to emitter of the parasitic bipolar transistor. This bipolar current generates electron-hole pairs of which the holes are collected in the floating body of the transistor. In this way, body charge is reinforced or refreshed during a read of a logic high data state. Conversely, during a read of a memory cell previously written to logic low data state, parasitic bipolar current does not flow, electron-hole pairs are not created, and body charge of the transistor is not changed.

Refresh operations of a transistor can also be affected by the hold state of the floating-body transistor. Depending on the transistor gate voltage during the hold state, either logic low data state retention or logic high data state retention is favored during the hold state. Typically gate voltage during hold is chosen so that logic low data and logic high data states have equal retention. In the second embodiment, however, the gate voltage during the hold state is selected so that the logic low data state is favored, and only the logic high data state needs to be refreshed.

The logic high data state is refreshed periodically in the second embodiment by reading the transistor to regenerate body charge as described above. Because it is the read operation that regenerates body charge, a write operation is not necessary. Also, because the read voltages applied to the transistor restore the logic high data state body charge, sense amp circuitry is not required for the refresh technique of the second embodiment.

The single-cycle refresh of the second embodiment accomplishes a refresh operation in one cycle so the refresh is faster and memory availability is higher. Furthermore, as described above, sense amps are not required for refresh using read without write (e.g., refresh of floating-body transistor in logic high data state). This means that entire rows of memory cells in multiple banks can be simultaneously refreshed. In memory array architectures like the DC source line array architecture, for which there are no source line drivers, entire banks of memory cells can be simultaneously refreshed.

Referring to FIGS. 1A, 1B, and 2, the single-cycle refresh of the first embodiment reads data and writes back either a logic low or logic high data state (as appropriate to the data read) during a single clock cycle. The read portion of the refresh is performed during a first portion of the clock cycle and is followed in the same clock cycle by an appropriate write operation. The read operation of the first embodiment applies control signals having predetermined voltages to gate 16 and source region 20 and drain region 22 of transistor 14. As an example, the control signals include a gate voltage of approximately $V_g=-0.5$ v, source voltage of approximately $V_s=2.5$ v and drain voltage of approximately $V_d=0$ v, respectively, but are not so limited.

The write portion of the refresh is performed during a second, remaining, or last portion of the same clock cycle as the read portion. The write operation writes back either a logic low or logic high data state according to the data read during the read portion of the refresh. When the write operation is refreshing a logic high data state, for example, the write operation of the first embodiment applies control signals that include a gate voltage of approximately $V_g=0.5$ v, source voltage of approximately $V_s=2.5$ v and drain voltage of approximately $V_d=0$ v, respectively, but are not so limited. A logic high programming operation of the first embodiment can include a two stage control signal application during which the gate voltage during the write operation is changed from a first voltage level (e.g., $V_g=0.5$ v) to a second voltage level (e.g., $V_g=-1.2$ v), but the embodiment is not so limited.

When the write portion of the refresh operation is refreshing a logic low data state, for example, the write operation of the first embodiment applies control signals that include a gate voltage of approximately $V_g=0.5$ v, source voltage of approximately $V_s=2.5$ v and drain voltage of approximately $V_d=0.5$ v, respectively, but are not so limited. A logic low programming operation of the first embodiment can include a two stage control signal application during which the gate voltage during the write operation is changed from a first voltage level (e.g., $V_g=0.5$ v) to a second voltage level (e.g., $V_g=-1.2$ v), but the embodiment is not so limited.

The voltage levels to implement the refresh operations are merely examples of control signals. Indeed, the indicated voltage levels may be relative or absolute. Alternatively, the voltages indicated may be relative in that each voltage level, for example, may be increased or decreased by a given voltage amount (for example, each of the gate, source, and drain voltage may be increased or decreased by 0.5, 1.0 and 2.0 volts) whether one or more of the voltages (for example, the source, drain or gate voltages) become or are positive and negative.

Figure 3:
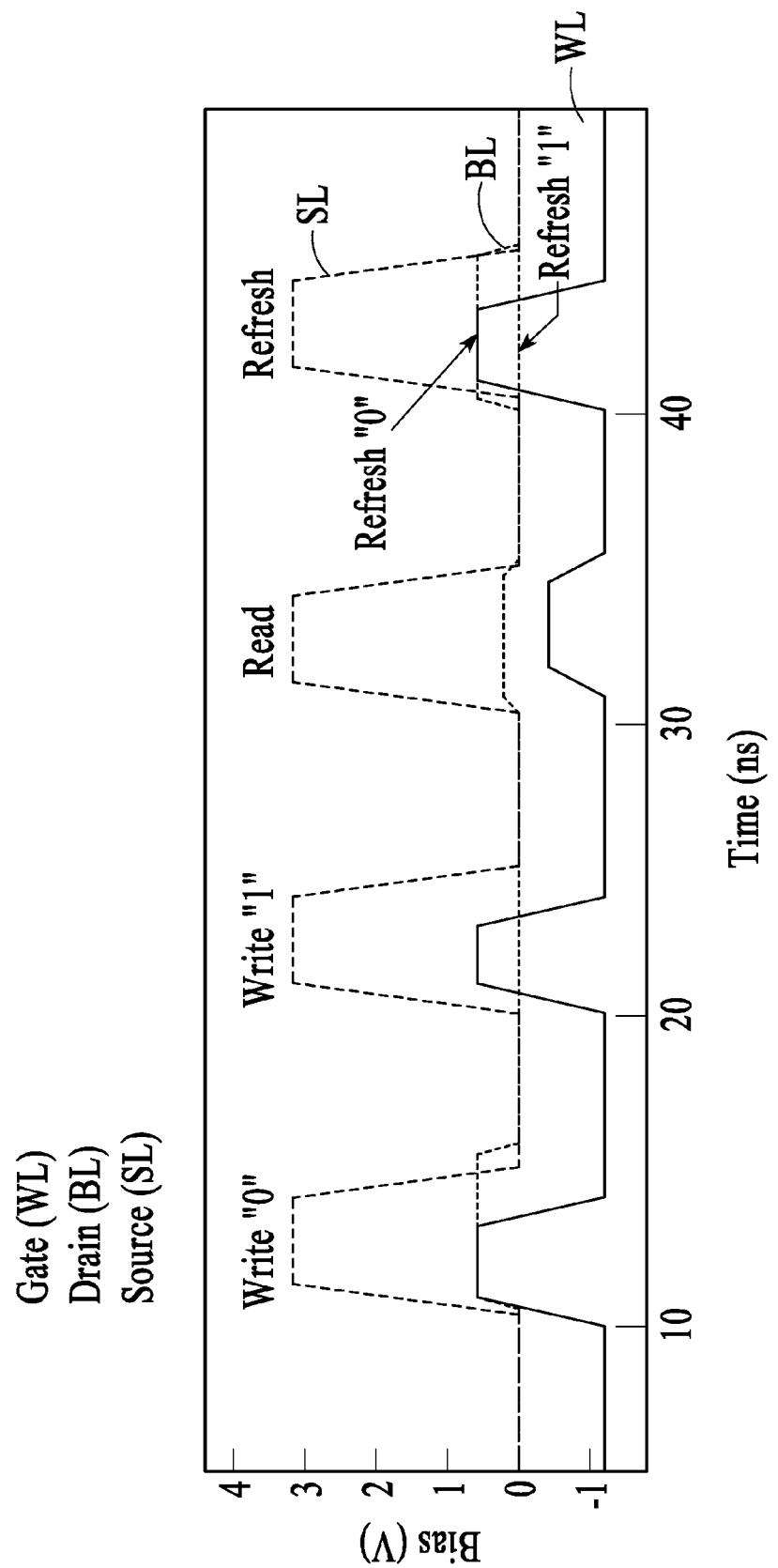
FIG. 3 shows relative magnitudes and timing of control signal application to a floating-body transistor during multi-cycle refresh operations, under an embodiment.

The single-cycle refresh is in contrast to conventional refresh operations of floating-body transistors. FIG. 3 shows relative magnitudes and timing of control signal application to a floating-body transistor 14 during multi-cycle refresh operations. The multi-cycle refresh operations make use of a read operation applied to the transistor during a first clock cycle, followed by a refresh (write) operation applied to the transistor during a second or subsequent clock cycle. The refresh (write) operation that follows the read includes a write operation that writes either a logic low or logic high data state to the transistor as appropriate to the data read from the transistor during the read operation.

FIG. 3 separately shows bias signals or voltages versus time for each of the read, write logic low ("0") and write logic high ("1") operations. The timing and magnitude of these signals are shown as examples only and are not intended to limit the embodiments described herein to the timing and magnitude shown in this figure.

Figure 4A:
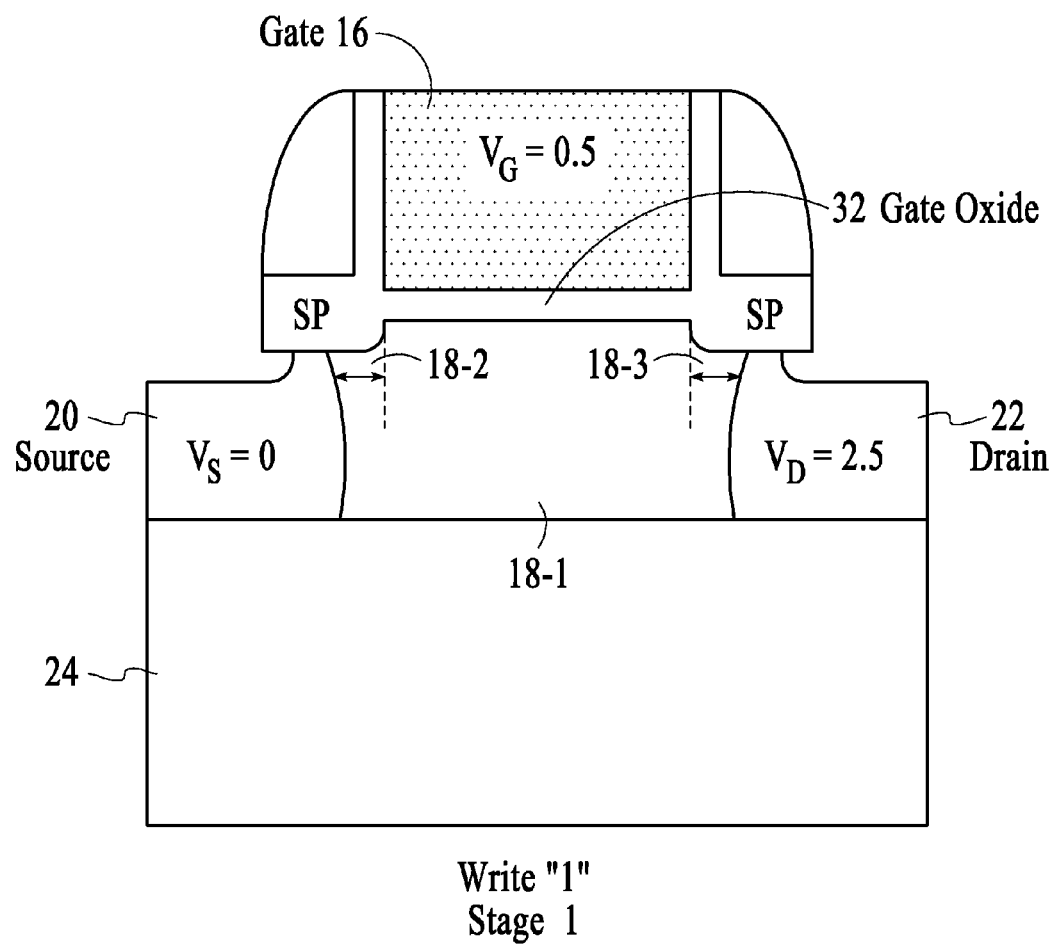
FIGS. 4A-4B show various stages of operation of transistor when writing or programming logic "1", under an embodiment.
Figure 4B:
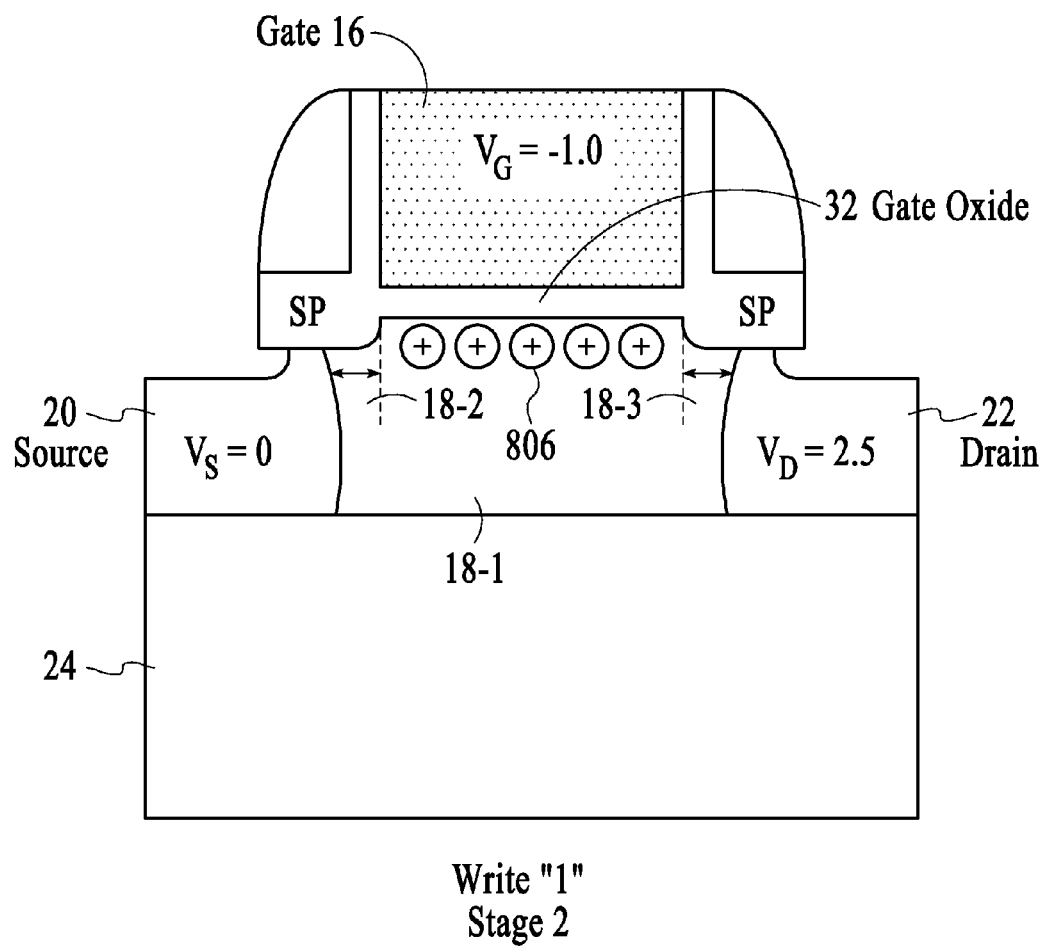

As described herein, the read and write operations of the refresh operation are the same as or similar to independent read and write operations used to program and read the transistor. Consequently, and as an example of read operations used during the single-cycle refresh of an embodiment, FIGS. 4A-4B show operation of transistor 14 when writing or programming a logic "1", under an embodiment. The transistor 14 of this embodiment is an N-channel or nMOS FET, but is not so limited; transistor 14 may be a P-channel or pMOS FET in an alternative embodiment. The N-channel device includes source 20 and drain 22 regions comprising N+-type material while the body region 18 comprises a P-type material.

As a general example for use with floating-body transistors, a logic "1" programming operation of an embodiment includes a two stage control signal application during which the gate voltage is changed from a first voltage level to a second voltage level. In operation, when writing or programming logic "1", in one embodiment, control signals having predetermined voltages (e.g., $V_g=0.5$ v, $V_s=0$ v, and $V_d=2.5$ v) are initially applied during stage one to gate 16, source region 20 and drain region 22 (respectively) of transistor 14 of memory cell 12 (FIG. 4A). The stage one control signals may result in an accumulation of majority carriers (not shown) in the electrically floating body 18. As a result of the polarity (e.g., positive) of the control signal applied to the gate with the stage one control signals, any majority carriers that happen to be present in the body region 18 accumulate in the first portion 18-1 of the body 18. The majority carriers may accumulate in an area of the first portion 18-1 under the gate, but are not so limited.

Furthermore, even if an inversion channel were to form in the first portion 18-1 of the body region as a result of the gate voltage, the inversion channel would not form in the second 18-2 and third 18-3 portions of the body region because these regions 18-2/18-3 are not under the gate. Therefore, any inversion channel formed under the embodiments described herein would be "disconnected" from or discontinuous with the source 20 and drain 22 regions.

The stage one control signals also generate or provide a source current in electrically floating body region 18 of transistor 14. More specifically, the potential difference between the source voltage and the drain voltage (e.g., 2.5 volts) is greater than the threshold required to turn on the bipolar transistor. Therefore, source current of the transistor causes or produces impact ionization and/or the avalanche multiplication phenomenon among carriers in the electrically floating body region 18. The impact ionization produces, provides, and/or generates an excess of majority carriers 806 (FIG. 4B) in the electrically floating body region 18 of transistor 14 of memory cell 12 as described above.

Notably, it is preferred that the source current responsible for impact ionization and/or avalanche multiplication in electrically floating body region 18 is initiated or induced by the control signal applied to gate 16 of transistor 14 along with the potential difference between the source 20 and drain 22 regions. Such a control signal may induce channel impact ionization which raises or increases the potential of body region 18 and "turns on", produces, causes and/or induces a source current in transistor 14. One advantage of the proposed writing/programming technique is that a large amount of the excess majority carriers 806 may be generated and stored in electrically floating body region 18 of transistor 14.

The stage two control signals are subsequently applied to the transistor when writing or programming logic "1" as described above. The stage two control signals are control signals having predetermined voltages (for example, $V_g=-1.0$ v, $V_s=0$ v, and $V_d=2.5$ v) applied to gate 16, source region 20 and drain region 22 (respectively) of transistor 14 of memory cell 12 (FIG. 4B) subsequent to stage one. As a result of the polarity (e.g., negative) of the control signal applied to the gate with the stage two control signals, the majority carriers 806 of the body region 18 accumulate near the surface of the first portion 18-1 of the body region (FIG. 4B). The polarity of the gate signal (e.g., negative) combined with the floating body causes the majority carriers 806 to become trapped or "stored" near the surface of the first portion 18-1 of the body region. In this manner the body region 18 of the transistor "stores" charge (e.g., equivalently, functions like a capacitor). Thus, in this embodiment, the predetermined voltages of the stage one and stage two control signals program or write logic "1" in memory cell 12 via impact ionization and/or avalanche multiplication in electrically floating body region 18.

Figure 5A:
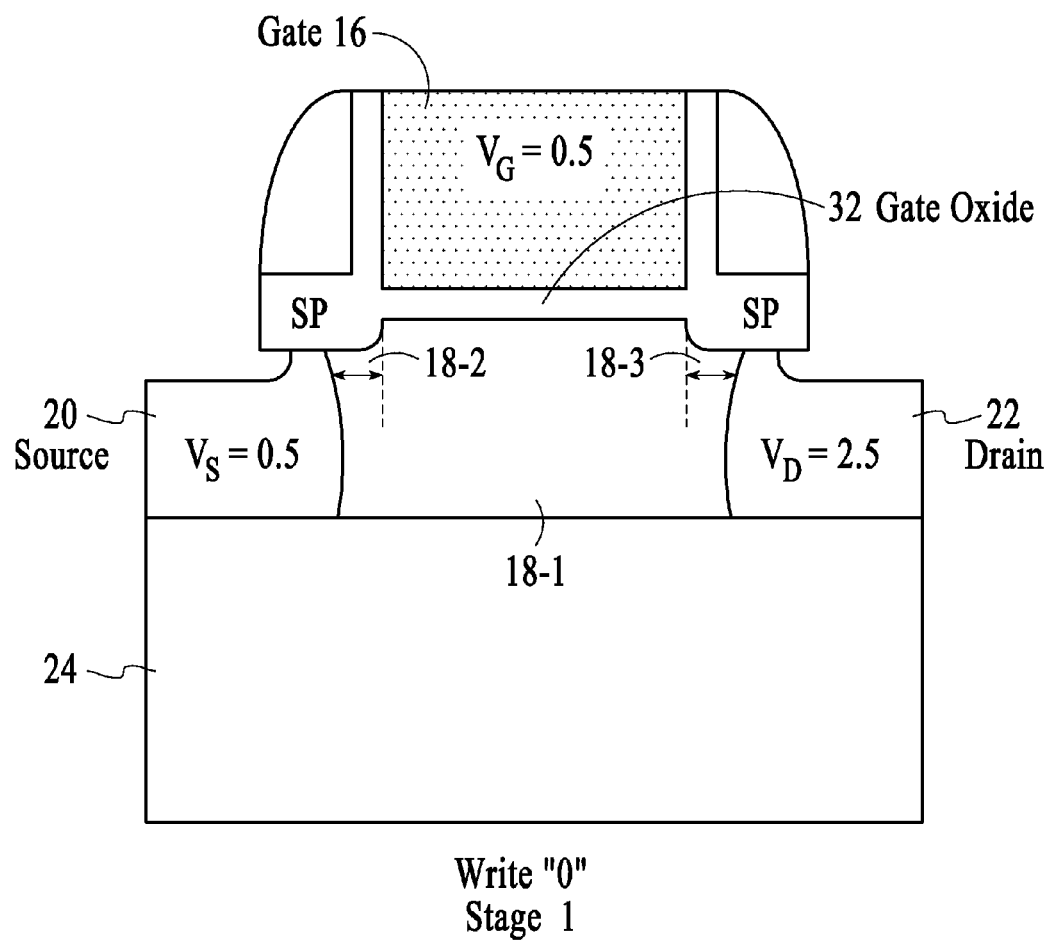
FIGS. 5A-5B show various stages of operation of transistor when writing or programming logic "0", under an embodiment.
Figure 5B:
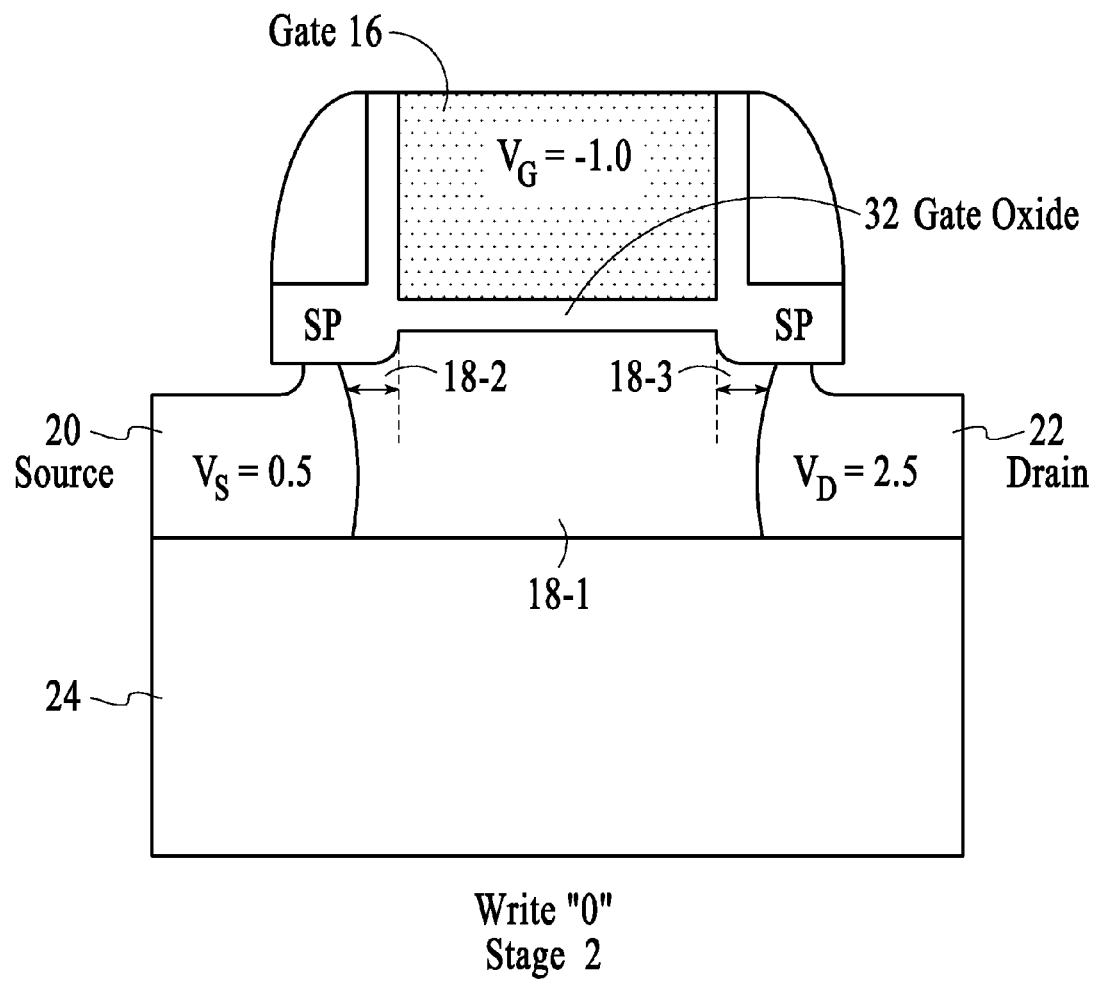

FIGS. 5A-5B show operation of transistor 14 when writing or programming logic "0", under an embodiment. As a general example for use with floating-body transistors, a logic "0" programming operation of an embodiment includes a two stage control signal application during which the gate voltage is changed from a first voltage level to a second voltage level. In operation, when writing or programming logic "0", in one embodiment, control signals having predetermined voltages (for example, Vg=0.5 v, Vs=0.5 v, and Vd=2.5 v) are initially applied during stage one to gate 16, source region 20 and drain region 22 (respectively) of transistor 14 of memory cell 12 (FIG. 5A). The stage one control signals may result in an accumulation of minority carriers (not shown) in the electrically floating body 18. More specifically, as a result of the polarity (e.g., positive) of the control signal applied to the gate with the stage one control signals, any accumulation of minority carriers occurs under the gate 16 in the first portion 18-1 of the body region, in an area that is close to the interface between gate dielectric 32 and electrically floating body 18 as described above. Any minority carriers that accumulate are in the first portion 18-1 of the body region as a result of the gate voltage, and thus do not accumulate in the second 18-2 and third 18-3 portions of the body region. Therefore, the accumulated charge of the body region 18 is discontinuous with the source 20 and drain 22 regions.

The potential difference between the source voltage and the drain voltage (e.g., 2.0 volts) of the stage one control signals, however, is less than the threshold required to turn on transistor 14. Consequently, no impact ionization takes place among carriers in the body region 18 and no bipolar or source current is produced in the electrically floating body region 18. Thus, no excess of majority carriers are generated in the electrically floating body region 18 of transistor 14 of memory cell 12.

The stage two control signals are subsequently applied to the transistor 14 when writing or programming logic "0" as described above. The stage two control signals are control signals having predetermined voltages (for example, Vg=−1.0 v, Vs=0.5 v, and Vd=2.5 v) applied to gate 16, source region 20 and drain region 22 (respectively) of transistor 14 of memory cell 12 (FIG. 5B) subsequent to stage one. The polarity (e.g., negative) of the gate signal may result in any minority carriers that accumulate being removed from electrically floating body region 18 of transistor 14 via one or more of the source region 20 and the drain region 22. Furthermore, the polarity of the gate signal (e.g., negative) causes any minority carriers remaining in the body region 18 to be trapped or "stored" near the surface of the first portion of the body region 18. The result is an absence of excess majority carriers in the body region 18 so that, in this manner, the predetermined voltages of the stage one and stage two control signals program or write logic "0" in memory cell 12.

A logic "0" programming operation of an alternative embodiment includes a two stage control signal application during which the gate voltage is changed from a first voltage level to a second voltage level. In operation, when writing or programming logic "0", in this alternative embodiment, control signals having predetermined voltages (for example, Vg=0 v, Vs=0 v, and Vd=0 v) are initially applied during stage one to gate 16, source region 20 and drain region 22 (respectively) of transistor 14 of memory cell 12.

The voltage levels described here as control signals to implement the write operations are provided merely as examples, and the embodiments described herein are not limited to these voltage levels. The control signals increase the potential of electrically floating body region 18 which "turns on", produces, causes and/or induces a source current in the transistor of the memory cell. In the context of a write operation, the source current generates majority carriers in the electrically floating body region which are then stored. In the context of a read operation, the data state may be determined primarily by, sensed substantially using and/or based substantially on the source current that is responsive to the read control signals, as described above, and significantly less by the interface channel current component, which is less significant and/or negligible relative to the bipolar component.

Accordingly, the voltage levels to implement the write operations are merely examples of control signals. Indeed, the indicated voltage levels may be relative or absolute. Alternatively, the voltages indicated may be relative in that each voltage level, for example, may be increased or decreased by a given voltage amount (for example, each of the gate, source, and drain voltage may be increased or decreased by 0.5, 1.0 and 2.0 volts) whether one or more of the voltages (for example, the source, drain or gate voltages) become or are positive and negative.

Figure 6:
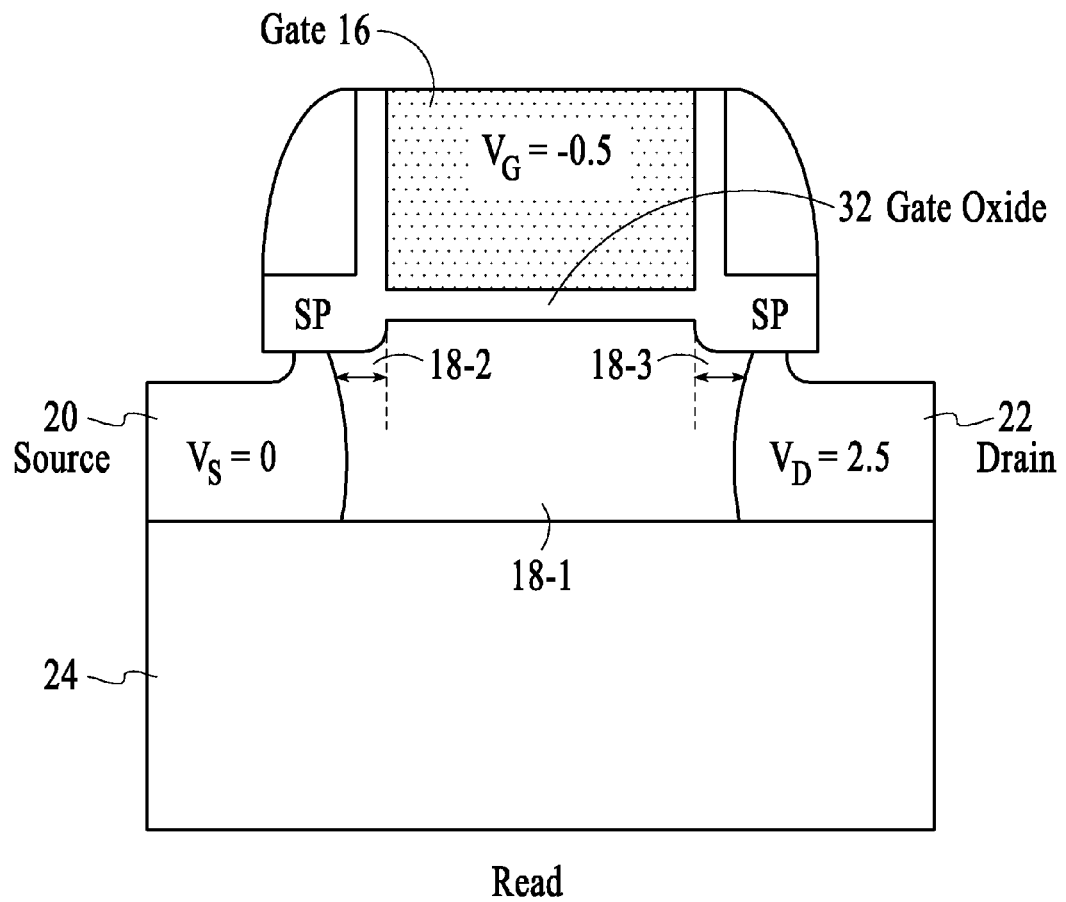
FIG. 6 is an example of an operation under which the data state of a memory cell may be read and/or determined by applying control signals having predetermined voltages to gate and source region and drain region of transistor, under an embodiment.

With reference to FIG. 6, and as a general example for use with floating-body transistors of an embodiment, the data state of memory cell 12 may be read and/or determined by applying control signals having predetermined voltages to gate 16 and source region 20 and drain region 22 of transistor 14 (for example, Vg=−0.5 v, Vs=2.5 v and Vd=0 v, respectively). Such control signals, in combination, induce and/or cause a source current in memory cells 12 that are programmed to logic "1" as described above. As such, sensing circuitry (for example, a cross-coupled sense amplifier), which is coupled to transistor 14 (for example, drain region 22) of memory cell 12, senses the data state using primarily and/or based substantially on the source current. Notably, for those memory cells 12 that are programmed to logic "0", such control signals induce, cause and/or produce little to no source current (for example, a considerable, substantial or sufficiently measurable source current).

Thus, in response to read control signals, electrically floating body transistor 14 generates a source current which is representative of the data state of memory cell 12. Where the data state is logic high or logic "1", electrically floating body transistor 14 provides a substantially greater source current than where the data state is logic low or logic "0". Electrically floating body transistor 14 may provide little to no source current when the data state is logic low or logic "0". As discussed in more detail below, data sensing circuitry determines the data state of the memory cell based substantially on the source current induced, caused and/or produced in response to the read control signals.

The voltage levels described here as control signals to implement the read operations are provided merely as examples, and the embodiments described herein are not limited to these voltage levels. The indicated voltage levels may be relative or absolute. Alternatively, the voltages indicated may be relative in that each voltage level, for example, may be increased or decreased by a given voltage amount (for example, each voltage may be increased or decreased by 0.5, 1.0 and 2.0 volts) whether one or more of the voltages (for example, the source, drain or gate voltages) become or are positive and negative.

Figure 7A:
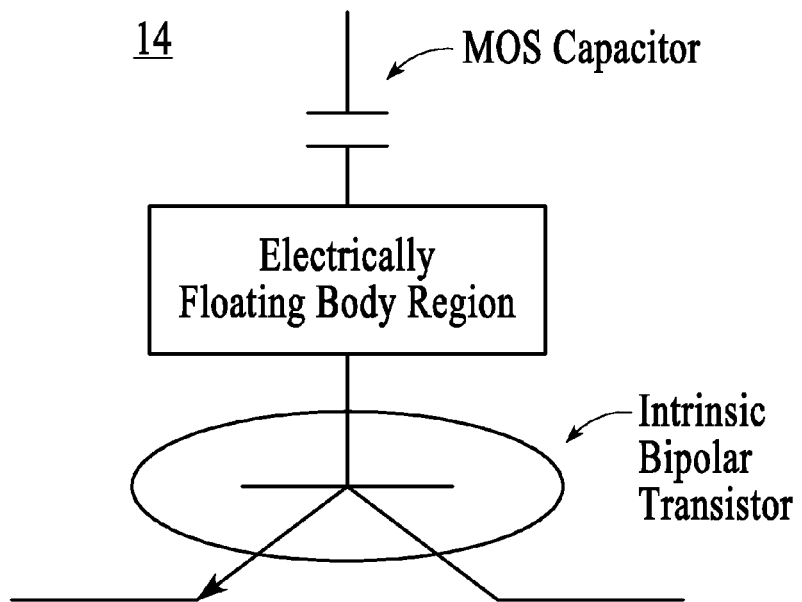
FIG. 7A shows electrically floating body transistor schematically illustrated as including a MOS capacitor "component" and an intrinsic bipolar transistor "component", under an embodiment.

FIG. 7A shows electrically floating body transistor 14 schematically illustrated as including a MOS capacitor "component" and an intrinsic bipolar transistor "component", under an embodiment. In one aspect, the present inventions employ the intrinsic bipolar transistor "component" to program/write as well as read memory cell 12. In this regard, the intrinsic bipolar transistor generates and/or produces a source or bipolar transistor current which is employed to program/write the data state in memory cell 12 and read the data state of memory cell 12. Notably, in this example embodiment, electrically floating body transistor 14 is an N-channel device. As such, majority carriers 34 are "holes".

The bipolar transistor 14 of an embodiment has a floating body, meaning the potential is not fixed or "floating". The potential for example depends on the charge at the gate. A conventional bipolar transistor requires each of base current, emitter current, and collector current for proper operation. Any base of the transistor 14 in this embodiment, however, is floating and not fixed because there is no base contact as found in conventional bipolar FETs; the current in this transistor is therefore referred to herein as a "source" current produced by impact ionization in the body region as described below.

Figure 7B:
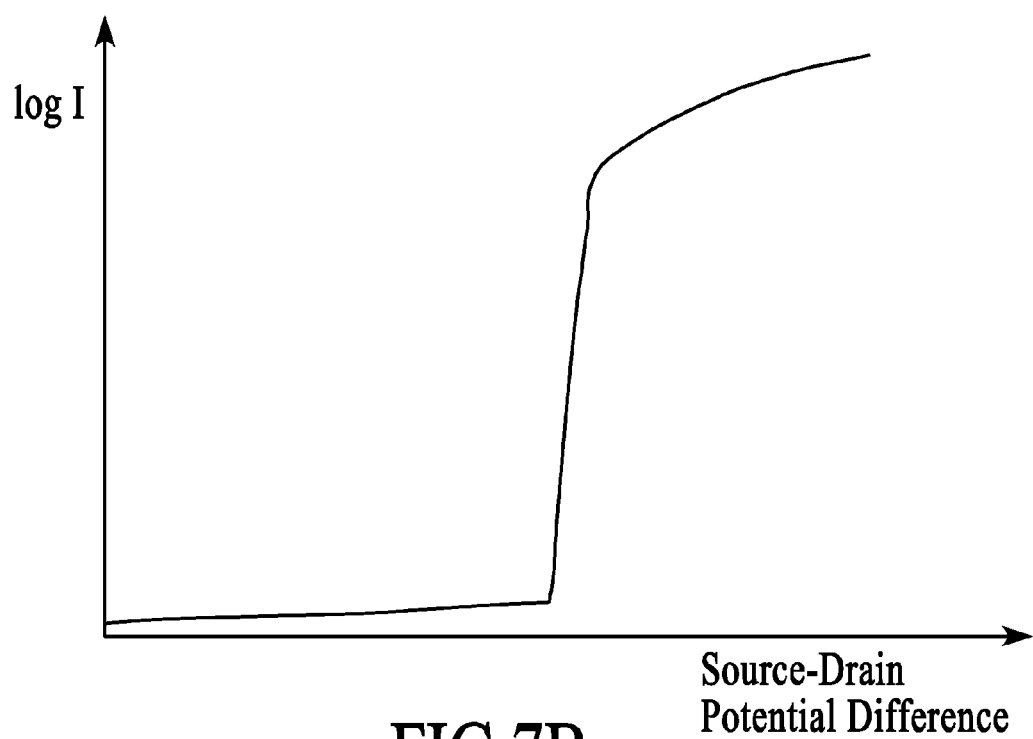
FIG. 7B is an example characteristic curve of electrically floating body transistor, under an embodiment.

FIG. 7B is an example characteristic curve of electrically floating body transistor 14, under an embodiment. The characteristic curve shows a significant increase in source current (e.g., "log I") at and above a specific threshold value of the potential difference between applied source voltage and applied drain voltage ("source-drain potential difference"). The reason for this is that a voltage differential at or above a certain threshold generates a high electric field in the body region. The high electric field results in impact ionization in the first portion 18-1 of the body region 18, a process during which electrons or particles with enough energy generate majority carriers i.e. holes. The impact ionization drives majority carriers to the body region, which increases the body potential, while any minority carriers flow to the drain (or source) region. The increased body potential results in an increase in source current in the body region; thus, the excess majority carriers of the body region generate source current of transistor 14 of an embodiment.

Figure 8:
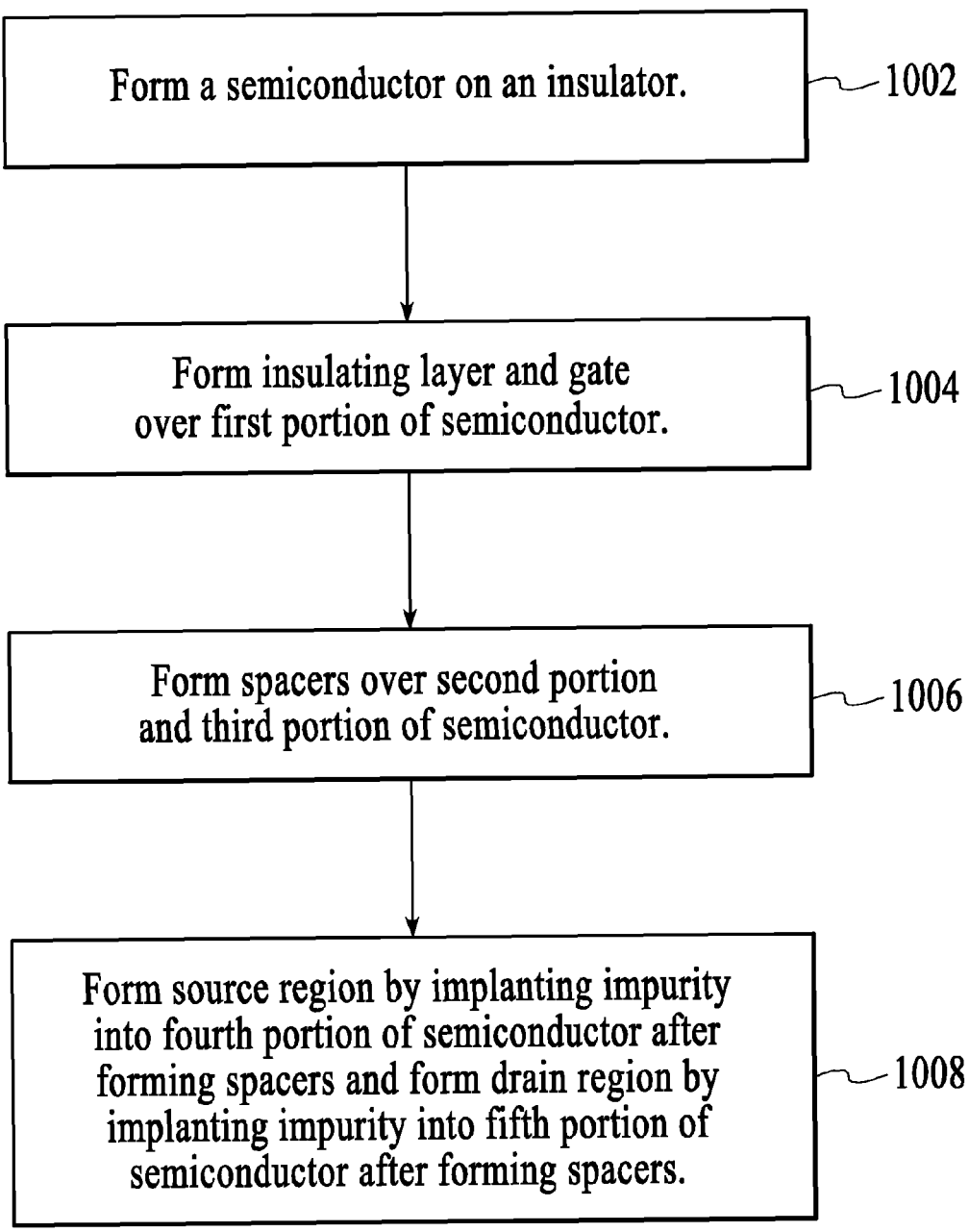
FIG. 8 is a flow diagram for forming a transistor, under an embodiment.

FIG. 8 is a flow diagram for forming transistor 14, under an embodiment. Transistor 14 is formed, generally, by forming 1002 a semiconductor on an insulator. An insulating layer and a gate is formed 1004 over a first portion of the semiconductor. Spacers are formed 1006 over a second portion and a third portion of the semiconductor, and the spacers adjoin the insulating layer. The first portion, second portion, and third portion of the semiconductor collectively form the floating body region. Formation of transistor 14 continues by forming 1008 a source region through implantation of an impurity into a fourth portion of the semiconductor after forming the spacers. The fourth portion of the semiconductor is adjacent the second portion. A drain region is also formed 1008 by implanting the impurity into a fifth portion of the semiconductor after forming the spacers. The fifth portion of the semiconductor is adjacent the third portion.

As mentioned above, the embodiments described herein may be implemented in an IC device (for example, a discrete memory device or a device having embedded memory) including a memory array having a plurality of memory cells arranged in a plurality of rows and columns wherein each memory cell includes an electrically floating body transistor. The memory arrays may comprise N-channel, P-channel and/or both types of transistors. Indeed, circuitry that is peripheral to the memory array (for example, data sense circuitry (for example, sense amplifiers or comparators), memory cell selection and control circuitry (for example, word line and/or source line drivers), as well as row and column address decoders) may include P-channel and/or N-channel type transistors.

Figure 9A:
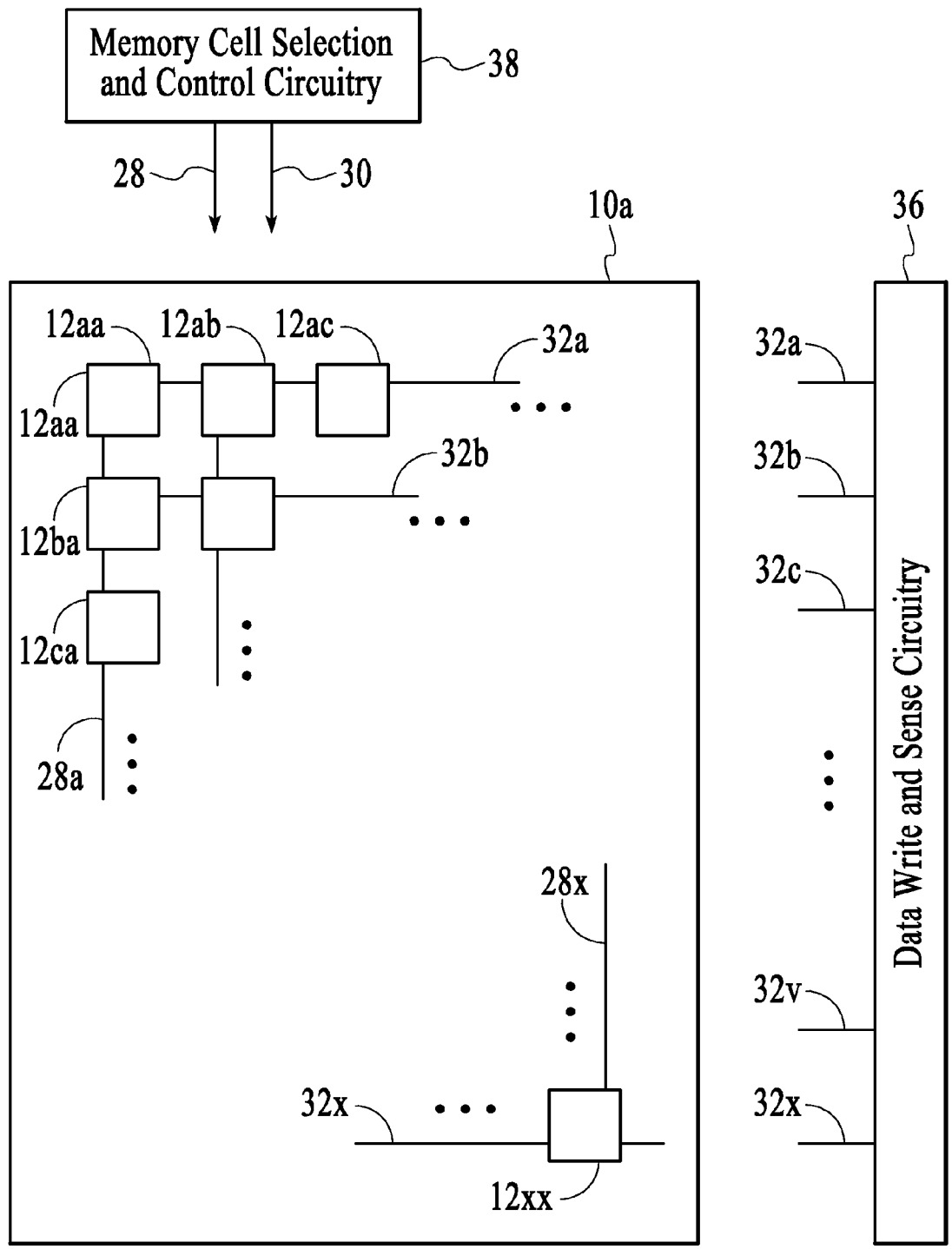
FIGS. 9A and 9B are schematic block diagrams of embodiments of an integrated circuit device including, among other things, a memory cell array, data sense and write circuitry, memory cell selection and control circuitry, according certain aspects of the present inventions.
Figure 9B:
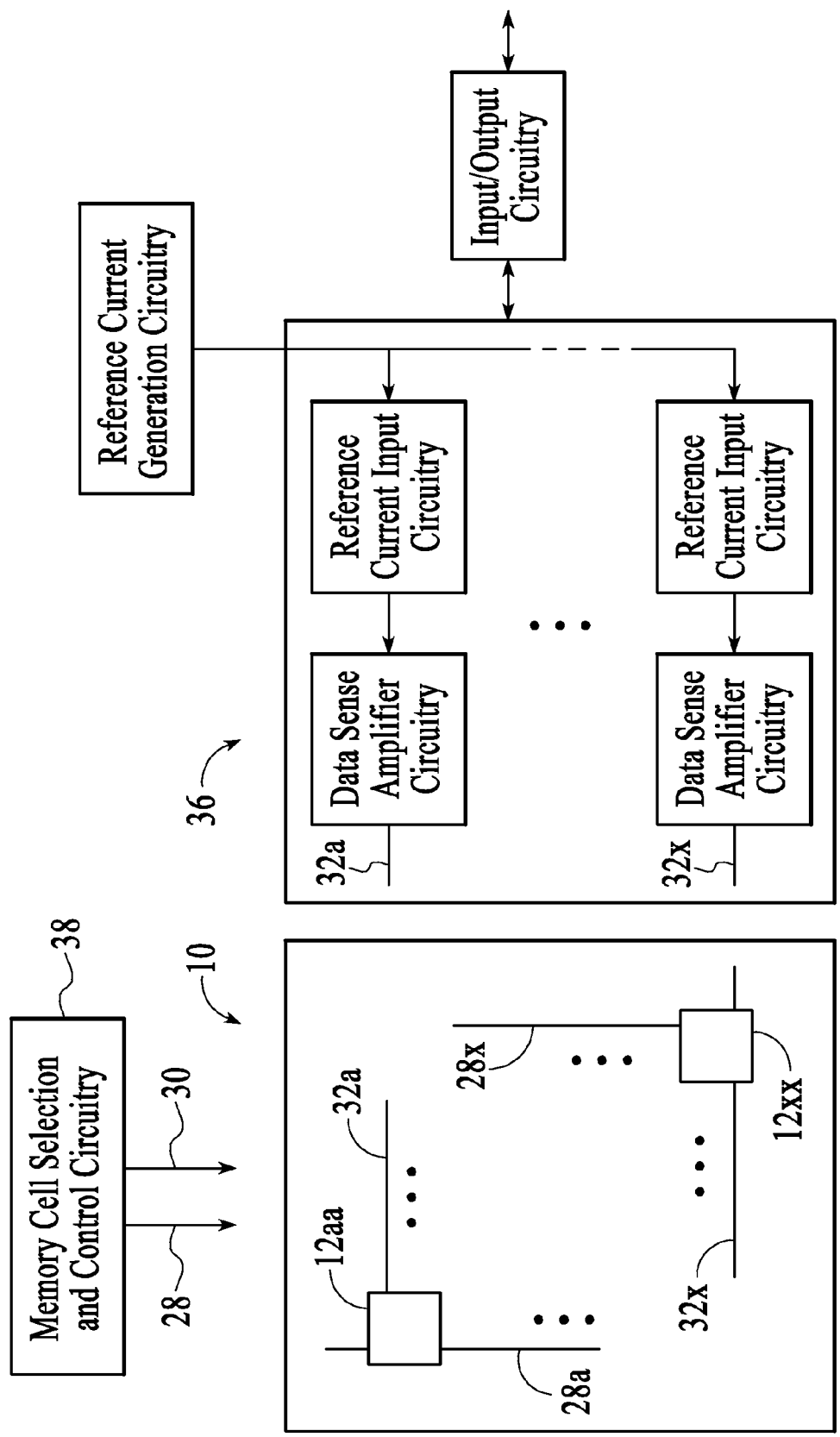

For example, with reference to FIGS. 9A and 9B, the integrated circuit device may include array 10, having a plurality of memory cells 12, data write and sense circuitry 36, and memory cell selection and control circuitry 38. The data write and sense circuitry 36 reads data from and writes data to selected memory cells 12. In one embodiment, data write and sense circuitry 36 includes one or more data sense amplifiers. Each data sense amplifier receives at least one bit line 32 and an output of reference generator circuitry (for example, a current or voltage reference signal). In one embodiment, the data sense amplifier may be a cross-coupled type sense amplifier as described and illustrated in the Non-Provisional U.S. patent application Ser. No. 11/299,590 (U.S. Patent Application Publication US 2006/0126374), filed by Waller and Carman, on Dec. 12, 2005, and entitled "Sense Amplifier Circuitry and Architecture to Write Data into and/or Read Data from Memory Cells", the application being incorporated herein by reference in its entirety) to sense the data state stored in memory cell 12 and/or write-back data into memory cell 12.

The data sense amplifier may employ voltage and/or current sensing circuitry and/or techniques. In the context of current sensing, a current sense amplifier may compare the current from the selected memory cell to a reference current, for example, the current of one or more reference cells. From that comparison, it may be determined whether memory cell 12 contained logic high (relatively more majority carries 34 contained within body region 18) or logic low data state (relatively less majority carries 28 contained within body region 18). Notably, the present inventions may employ any type or form of data write and sense circuitry 36 (including one or more sense amplifiers, using voltage or current sensing techniques, to sense the data state stored in memory cell 12) to read the data stored in memory cells 12, write data in memory cells 12 and/or refresh the data stored in memory cells 12.

Memory cell selection and control circuitry 38 selects and/or enables one or more predetermined memory cells 12 to facilitate reading data from, writing data to and/or refreshing data in the memory cells 12 by applying a control signal on one or more word lines 28. The memory cell selection and control circuitry 38 may generate such control signals using address data, for example, row address data. Indeed, memory cell selection and control circuitry 38 may include a conventional word line decoder and/or driver. There are many different control/selection techniques (and circuitry) to implement the memory cell selection technique. Such techniques, and circuitry, are well known to those skilled in the art. All such control/selection techniques, and circuitry, whether now known or later developed, are intended to fall within the scope of the present embodiments.

The present inventions may be implemented in any architecture, layout, and/or configuration comprising memory cells having electrically floating body transistors. For example, in one embodiment, memory array 10 including a plurality of memory cells 12 having a separate source line for each row of memory cells (a row of memory cells includes a common word line connected to the gates of each memory cell of the row). The memory array 10 may employ one or more of the example programming, reading, refreshing and/or holding techniques described above.

In one embodiment, the present inventions are implemented in conjunction with a two step write operation whereby all the memory cells of a given row are written to a predetermined data state by first executing a "clear" operation, whereby all of the memory cells of the given row are written or programmed to logic "0", and thereafter selective memory cells of the row are selectively write operation to the predetermined data state (here logic "1"). The present inventions may also be implemented in conjunction with a one step write operation whereby selective memory cells of the selected row are selectively written or programmed to either logic "1" or logic "0" without first implementing a "clear" operation.

Figure 10:
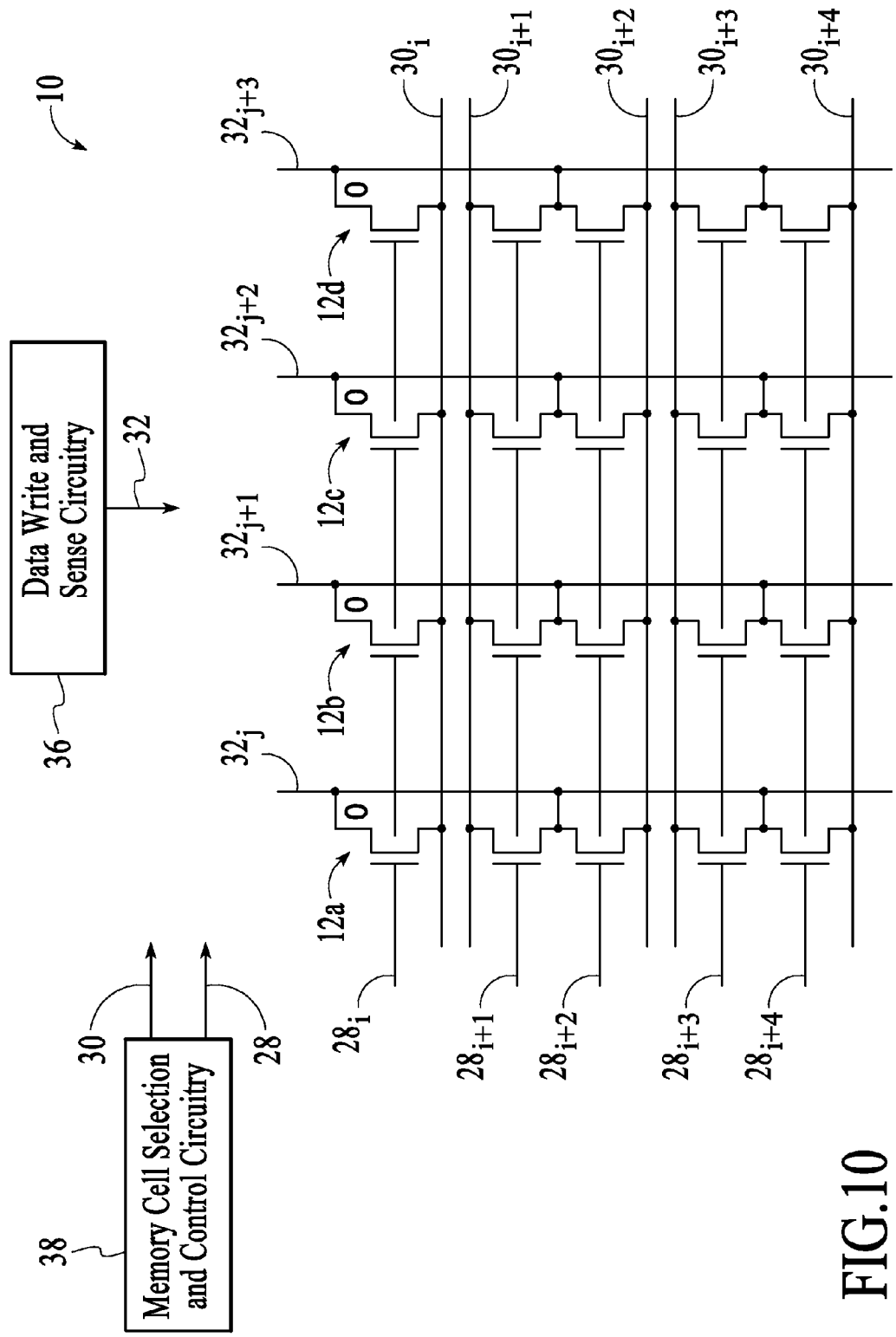
FIGS. 10-12 illustrate an embodiment of an exemplary memory array having a plurality of memory cells and employing a separate source line configuration for each row of memory cells, according to certain aspects of the present inventions.
Figure 11:
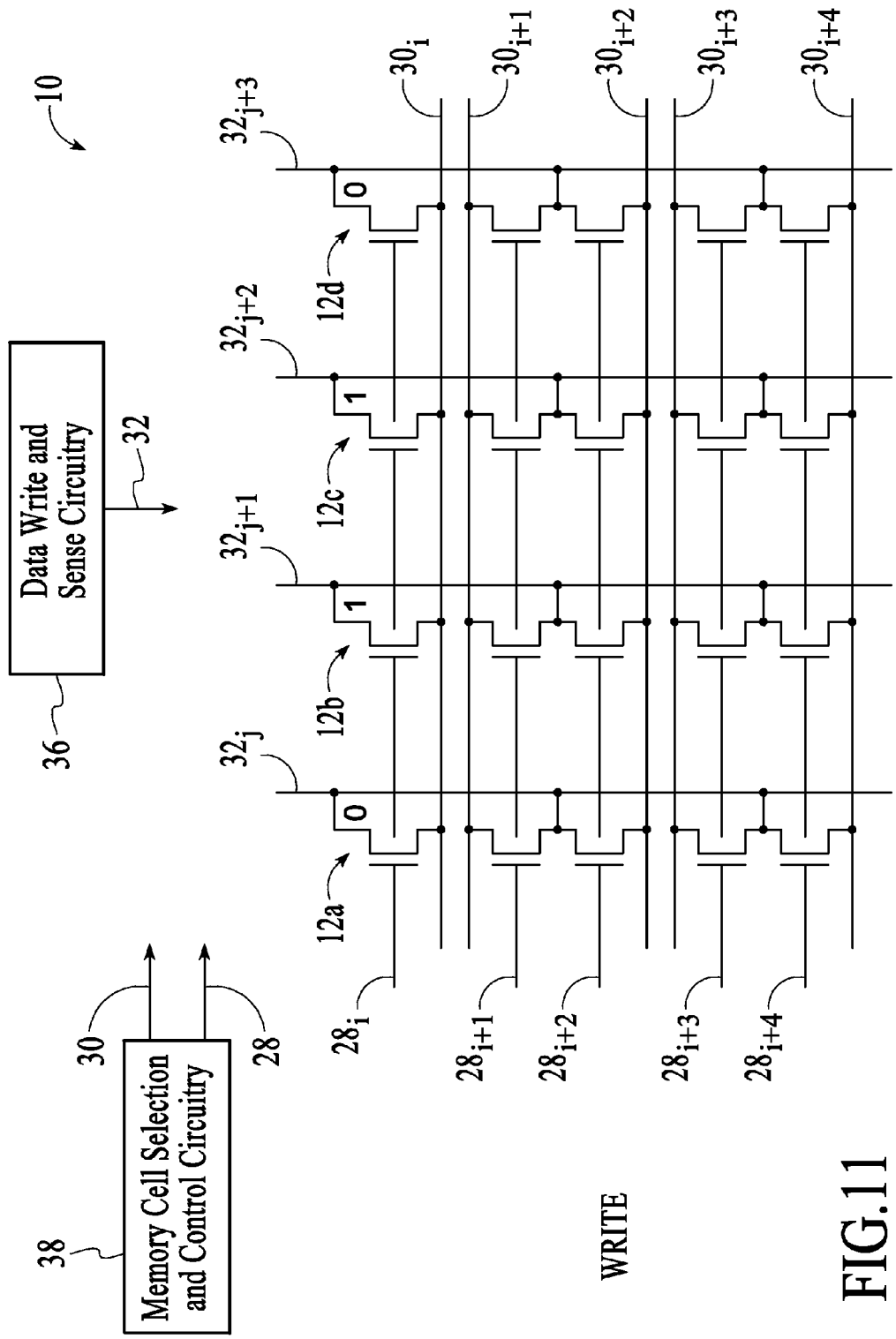

With reference to FIGS. 10 and 11, memory cells 12 may be programmed using the two step operation wherein a given row of memory cells are written to a first predetermined data state by first executing a "clear" operation (which, in this example embodiment, all of the memory cells of the given row are written or programmed to logic "0") and thereafter selected memory cells are written to a second predetermined data state (i.e., a selective write operation to the second predetermined data state). The "clear" operation may be performed by writing or programming each memory cell of the given row to a first predetermined data state (in this example embodiment the first predetermined data state is logic "0") using the inventive technique described above.

In particular, transistor of each memory cell 12 of a given row (for example, memory cells 12a-12d) is controlled to store a logic "0". In this regard, stage one and stage two control signals to implement a clear operation as described above are applied to the gate, the source region and the drain region of the transistor of memory cells 12a-12d. In response, the same logic state (for example, logic low or logic "0") is stored in memory cells 12a-12d and the state of memory cells 12a-12d are "cleared".

Thereafter, selected memory cells of the given row may be programmed to the second predetermined logic state. In this regard, the transistors of certain memory cells of a given row are written to the second predetermined logic state in order to store the second predetermined logic state in memory cells. For example, with reference to FIG. 11, memory cells 12b and 12c are programmed to logic high or logic "1" by applying (i) 0.5 v to the gate (via word line $28_i$), (ii) 0 v to the source region (via source line 30), and (iii) 2.5 v to the drain region (via bit line $32_{j+1}$ and $32_{j+2}$), followed by application of −1.0 v to the gate (via word line $28_i$). In particular, such control signals generate or provide an excess of majority carriers in the electrically floating body region of the transistor of memory cells 12b and 12c which corresponds to logic high or logic "1".

As mentioned above, it is preferred that the source current responsible for impact ionization and/or avalanche multiplication in the floating body is initiated or induced by the control signal (control pulse) applied to the gate of the transistor. Such a signal/pulse may induce the channel impact ionization which raises or increases the potential of the electrically floating body region of the transistor of memory cells 12b and 12c and "turns-on" and/or produces a source current in transistor 14. One advantage of the proposed method is that a large amount of the excess majority carriers may be generated and stored in the electrically floating body region of the transistor of memory cells 12b and 12c.

Notably, in this example embodiment, memory cells 12a and 12d are maintained at logic low (or logic "0") by applying an inhibit control signal to the drain region of each memory cell 12a and 12d. For example, applying 0 v to the drain regions of memory cells 12a and 12d (via bit lines $32_j$ and $32_{j+4}$) inhibits writing logic high or logic "1" into memory cells 12a and 12d during the selective write operation for memory cells 12b and 12c.

A "holding" operation or condition may be used for the other memory cells in memory cell array 10 to minimize and/or reduce the impact of the write operation for memory cells 12a-12d connected to word line $28_i$. In one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one example embodiment, a holding voltage approximately in a range of −0.8 volts to −1.6 volts (e.g., −1.2 volts) is applied to the gate of each transistor of the memory cells connected to word lines $28_{i+1}$, $28_{i+2}$, $28_{i+3}$, and $28_{i+4}$. In this way, the impact of the write operation of memory cells 12a-12d (which are connected to word line $28_i$) on the other memory cells of memory cell array 10 is minimized and/or reduced.

Figure 12:
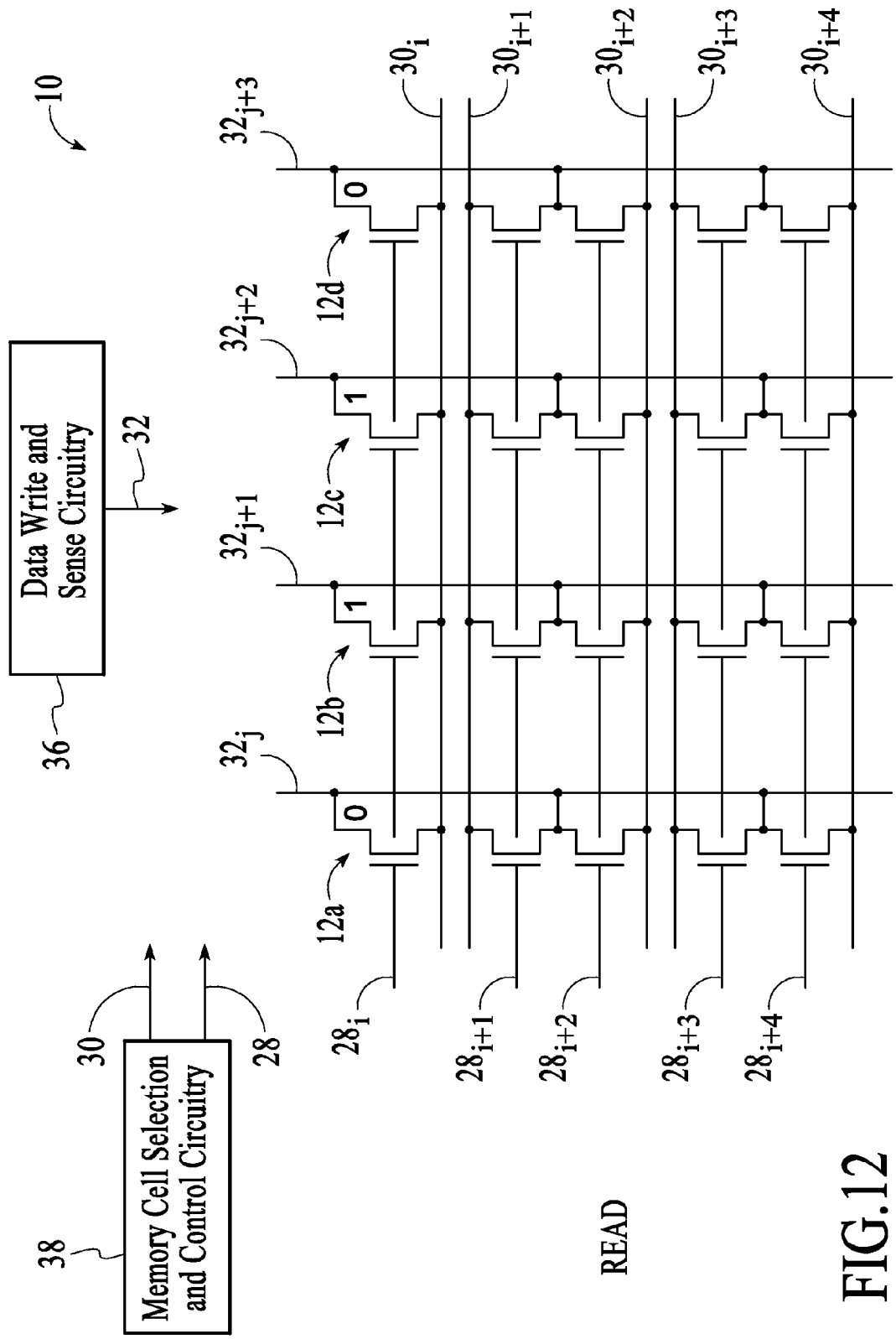

A selected row of memory cells may be read by applying read control signals to the associated word line 28 and associated source lines 30 and sensing a signal (voltage and/or current) on associated bit lines 32. In one example embodiment, with reference to FIG. 12, memory cells 12a-12d are read by applying (i) 0 v to the gate (via word line $28_i$), (ii) 0 v to the source region (via source line $30_i$) and (iii) a voltage approximately in a range of one (1) volt to 2.2 volts to the drain region (via bit line $32_{j+1}$ and $32_{j+2}$). The data write and sense circuitry 36 reads the data state of the memory cells 12a-12d by sensing the response to the applied read control signals. In response to the read control signals, memory cells 12a-12d generate a source current spike or pulse which is representative of the data state of memory cells 12a-12d, as described above. In this example, memory cells 12b and 12c (which were earlier programmed to logic "1"), in response to the read control signals, generate a source current spike which is considerably larger than any channel current. In contrast, in memory cells 12a and 12d (which were earlier programmed to logic "0"), the control signals induce, cause and/or produce little to no source current (for example, a considerable, substantial or sufficiently measurable source current). The sense circuitry 36 senses the data state using primarily and/or based substantially on the source current.

Thus, in response to read control signals, the electrically floating body transistor of each memory cell 12a-12d generates a source current spike which is representative of the data state stored therein. The data sensing circuitry in data write and sense circuitry 36 determines the data state of memory cells 12a-12d based substantially on the source current induced, caused and/or produced in response to the read control signals. Notably, as mentioned above, a read operation may be performed by applying other control signaling techniques.

Again, it may be advantageous to employ a "holding" operation or condition for the other memory cells in memory cell array 10 to minimize and/or reduce the impact of the read operation of memory cells 12a-12d. With continued reference to FIG. 12, in one embodiment, a holding voltage is applied to the gates of the transistors of other memory cells of memory cell array 10 (for example, each memory cell connected to word lines $28_{i+1}$, $28_{i+2}$, $28_{i+3}$, and $28_{i+4}$). In one example embodiment, a holding voltage approximately in a range of −0.8 volts to −1.6 volts (e.g., −1.2 volts) is applied to the gate of each transistor of the memory cells connected to word lines $28_{i+1}$, $28_{i+2}$, $28_{i+3}$, and $28_{i+4}$. In this way, the impact of the read operation of memory cells 12a-12d (which are connected to word line $28_i$) on the other memory cells of memory cell array 10 is minimized and/or reduced.

The programming, reading, and refreshing techniques described herein may be used in conjunction with a plurality of memory cells arranged in an array of memory cells. A memory array implementing the structure and techniques of the present inventions may be controlled and configured including a plurality of memory cells having a separate source line for each row of memory cells (a row of memory cells includes a common word line). The memory array may use any of the example programming, reading, refreshing, and/or holding techniques described herein. The memory arrays may comprise N-channel, P-channel and/or both types of transistors. Circuitry that is peripheral to the memory array (for example, sense amplifiers or comparators, row and column address decoders, as well as line drivers (not illustrated herein)) may include P-channel and/or N-channel type transistors. Where P-channel type transistors are employed as memory cells in the memory array(s), suitable write and read voltages (for example, negative voltages) are well known to those skilled in the art in light of this disclosure.

The present inventions may be implemented in any electrically floating body memory cell and memory cell array. For example, in certain aspects, the present inventions are directed to a memory array, having a plurality of memory cells each including an electrically floating body transistor, and/or technique of programming data into and/or reading data from one or more memory cells of such a memory cell array. In this aspect of the inventions, the data states of adjacent memory cells and/or memory cells that share a word line may or may not be individually programmed.

With reference to FIGS. 9A and 9B, memory array 10 may comprise a plurality of memory cells 12 of N-channel type, P-channel type and/or both types of electrically floating body transistors. The memory array 10 includes a plurality of rows and columns (for example, in a matrix form) of memory cells 12.

The circuitry which is peripheral to memory array 10 (for example, data write and sense circuitry 36 (such as, for example, sense amplifiers or comparators), memory cell selection and control circuitry 38 (such as, for example, address decoders and word line drivers)) may include P-channel type and/or N-channel type transistors. Where N-channel type transistors or P-channel type transistors are employed as memory cells 12 in memory array(s) 10, suitable write voltages are known to those skilled in the art.

As mentioned above, memory cells 12 (having electrically floating body transistor 14) and memory cell array 10 of the present inventions may be implemented in an integrated circuit device having a memory portion and a logic portion (see, for example, FIG. 9A), or an integrated circuit device that is primarily a memory device (see, for example, FIG. 9B). Indeed, the present inventions may be implemented in any device having one or more memory cells 12 (having electrically floating body transistors) and/or memory cell arrays 10. For example, with reference to FIG. 9A, an integrated circuit device may include array 10, having a plurality of memory cells 12 (having electrically floating body transistors), data write and sense circuitry, and memory cell selection and control circuitry (not illustrated in detail). The data write and sense circuitry writes data into and senses the data state of one or more memory cells. The memory cell selection and control circuitry selects and/or enables one or more predetermined memory cells 12 to be read by data sense circuitry during a read operation.

For example, the electrically floating body transistor, which programmed (written to), read, refreshed, and/or controlled using the techniques of the present inventions, may be employed in any electrically floating body memory cell, and/or memory cell array architecture, layout, structure and/or configuration employing such electrically floating body memory cells. In this regard, an electrically floating body transistor, which state is read using the techniques of the present inventions, may be implemented in the memory cell, architecture, layout, structure and/or configuration described and illustrated in the following non-provisional U.S. patent applications:

(1) application Ser. No. 10/450,238, which was filed by Fazan et al. on Jun. 10, 2003 and entitled "Semiconductor Device" (now U.S. Pat. No. 6,969,662);

(2) application Ser. No. 10/487,157, which was filed by Fazan et al. on Feb. 18, 2004 and entitled "Semiconductor Device" (U.S. Patent Application Publication No. 2004/0238890);

(3) application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163);

(4) application Ser. No. 10/840,009, which was filed by Ferrant et al. on May 6, 2004 and entitled "Semiconductor Memory Device and Method of Operating Same" (U.S. Patent Application Publication No. 2004/0228168); and (5) application Ser. No. 10/941,692, which was filed by Fazan et al. on Sep. 15, 2004 and entitled "Low Power Programming Technique for a One Transistor SOI Memory Device & Asymmetrical Electrically Floating Body Memory Device, and Method of Manufacturing Same" (U.S. Patent Application Publication No. 2005/0063224).

Notably, the memory cells may be controlled (for example, programmed or read) using any of the control circuitry described and illustrated in the above-referenced five (5) U.S. patent applications. For the sake of brevity, those discussions will not be repeated; such control circuitry is incorporated herein by reference. Indeed, all memory cell selection and control circuitry for programming, reading, refreshing, controlling and/or operating memory cells including electrically floating body transistors, whether now known or later developed, are intended to fall within the scope of the present inventions.

Moreover, the data write and data sense circuitry may include a sense amplifier (not illustrated in detail herein) to read the data stored in memory cells 12. The sense amplifier may sense the data state stored in memory cell 12 using voltage or current sensing circuitry and/or techniques. In the context of a current sense amplifier, the current sense amplifier may compare the cell current to a reference current, for example, the current of a reference cell (not illustrated). From that comparison, it may be determined whether memory cell 12 contained logic high (relatively more majority carriers 34 contained within body region 18) or logic low data state (relatively less majority carriers 34 contained within body region 18). Such circuitry and configurations thereof are well known in the art.

In addition, the present inventions may employ the reference generation techniques (used in conjunction with the data sense circuitry for the read operation) described and illustrated in U.S. Provisional Patent Application Ser. No. 60/718,417, which was filed by Bauser on Sep. 19, 2005, and entitled "Method and Circuitry to Generate a Reference Current for Reading a Memory Cell Having an Electrically Floating Body Transistor, and Device Implementing Same". The entire contents of the U.S. Provisional Patent Application Ser. No. 60/718,417 are incorporated herein by reference. Further, the present inventions may also employ the read circuitry and techniques described and illustrated in U.S. patent application Ser. No. 10/840,902, which was filed by Portmann et al. on May 7, 2004, and entitled "Reference Current Generator, and Method of Programming, Adjusting and/or Operating Same" (now U.S. Pat. No. 6,912,150). The contents of U.S. Provisional Patent Application Ser. No. 60/718,417 and U.S. Pat. No. 6,912,150 are hereby incorporated by reference herein.

It should be further noted that while each memory cell 12 in the example embodiments (described above) includes one transistor 14, memory cell 12 may include two transistors, as described and illustrated in application Ser. No. 10/829,877, which was filed by Ferrant et al. on Apr. 22, 2004 and entitled "Semiconductor Memory Cell, Array, Architecture and Device, and Method of Operating Same" (U.S. Patent Application Publication No. 2005/0013163). The contents of U.S. Patent Application Publication No. 2005/0013163 are hereby incorporated by reference herein The electrically floating memory cells, transistors and/or memory array(s) may be fabricated using well known techniques and/or materials. Indeed, any fabrication technique and/or material, whether now known or later developed, may be employed to fabricate the electrically floating memory cells, transistors and/or memory array(s). For example, the present inventions may employ silicon, germanium, silicon/germanium, gallium arsenide or any other semiconductor material (whether bulk-type or SOI) in which transistors may be formed. As such, the electrically floating memory cells may be disposed on or in (collectively "on") SOI-type substrate or a bulk-type substrate.

Indeed, the electrically floating transistors, memory cells, and/or memory array(s) may employ the techniques described and illustrated in non-provisional patent application entitled "Integrated Circuit Device, and Method of Fabricating Same", which was filed on Jul. 2, 2004, by Fazan, Ser. No. 10/884,481 (U.S. Patent Application Publication No. 2005/0017240), provisional patent application entitled "One Transistor Memory Cell having Mechanically Strained Electrically Floating Body Region, and Method of Operating Same", which was filed on Oct. 19, 2005, Ser. No. 60/728,060, by Bassin, and/or provisional patent application entitled "Memory Cell, Array and Device, and Method of Operating Same", which was filed on Oct. 19, 2005, Ser. No. 60/728,061, by Okhonin et al. (hereinafter collectively "Integrated Circuit Device Patent Applications"). The contents of the Integrated Circuit Device Patent Applications are hereby incorporated by reference herein.

Memory array 10 (including SOI memory transistors) further may be integrated with SOI logic transistors, as described and illustrated in the Integrated Circuit Device Patent Applications. For example, in one embodiment, an integrated circuit device includes memory section (having, for example, partially depleted (PD) or fully depleted (FD) SOI memory transistors 14) and logic section (having, for example, high performance transistors, multiple gate transistors, and/or non-high performance transistors (for example, single gate transistors that do not possess the performance characteristics of high performance transistors).

Further, memory array(s) 10 may comprise N-channel, P-channel and/or both types of transistors, as well as partially depleted and/or fully depleted type transistors. For example, circuitry that is peripheral to the memory array (for example, sense amplifiers or comparators, row and column address decoders, as well as line drivers (not illustrated herein)) may include FD-type transistors (whether P-channel and/or N-channel type). Alternatively, such circuitry may include PD-type transistors (whether P-channel and/or N-channel type). There are many techniques to integrate both PD and/or FD-type transistors on the same substrate (see, for example, application Ser. No. 10/487,157, which was filed by Fazan et al. on Feb. 18, 2004 and entitled "Semiconductor Device" (U.S. Patent Application Publication No. 2004/0238890)). All such techniques, whether now known or later developed, are intended to fall within the scope of the present inventions. Where P-channel type transistors are employed as memory cells 12 in the memory array(s), suitable write and read voltages (for example, negative voltages) are well known to those skilled in the art in light of this disclosure.

Notably, electrically floating body transistor 14 may be a symmetrical or non-symmetrical device. Where transistor 14 is symmetrical, the source and drain regions are essentially interchangeable. However, where transistor 14 is a non-symmetrical device, the source or drain regions of transistor 14 have different electrical, physical, doping concentration and/or doping profile characteristics. As such, the source or drain regions of a non-symmetrical device are typically not interchangeable. This notwithstanding, the drain region of the electrically floating N-channel transistor of the memory cell (whether the source and drain regions are interchangeable or not) is that region of the transistor that is connected to the bit line/sense amplifier.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

As mentioned above, the illustrated/example voltage levels to implement the read and write operations are merely examples. The indicated voltage levels may be relative or absolute. Alternatively, the voltages indicated may be relative in that each voltage level, for example, may be increased or decreased by a given voltage amount (for example, each voltage may be increased or decreased by 0.1, 0.15, 0.25, 0.5, 1 volt) whether one or more of the voltages (for example, the source, drain or gate voltages) become or are positive and negative.

The illustrated/example voltage levels and timing to implement the write and read operations are merely examples. In this regard, in certain embodiments, the control signals increase the potential of electrically floating body region of the transistor of the memory cell which "turns on" or produces a source current in the transistor. In the context of a write operation, the source current generates majority carriers in the electrically floating body region which are then stored. In the context of a read operation, the data state may be determined primarily by, sensed substantially using and/or based substantially on the source current that is responsive to the read control signals and significantly less by the interface channel current component, which is less significant and/or negligible relatively to the bipolar component.

Aspects of the present inventions described herein, and/or embodiments thereof, may include an integrated circuit (IC) device. The IC device of an embodiment comprises a memory cell including a transistor. The transistor of an embodiment includes a gate, a body region configured to be electrically floating, and a source region and a drain region adjacent the body region. The IC device of an embodiment comprises refresh circuitry coupled to the memory cell. The refresh circuitry of an embodiment is configured to refresh data of the transistor by sequentially applying to the transistor, during a single clock cycle, read control signals and one of first write control signals and second write control signals.

The refresh circuitry of an embodiment is configured to refresh data of the transistor by applying to the transistor voltage levels substantially the same as read control signals.

The read control signals of an embodiment include a first gate signal applied to a gate of the transistor and a first potential difference applied between a source and a drain of the transistor. The first gate signal of an embodiment includes a voltage approximately in a range of −1.2 volts to zero (0) volts.

The refresh circuitry of an embodiment is configured to apply the first write control signals to the transistor when detecting a logic high data state in the transistor in response to the applying of the read control signals.

The refresh circuitry of an embodiment is configured to apply the second write control signals to the transistor when detecting a logic low data state in the transistor in response to the applying of the read control signals.

The first write control signals and second write control signals of an embodiment include a second gate signal applied to the gate.

The second gate signal of an embodiment includes a voltage approximately in a range of zero (0) volts to one (1) volt.

The first write control signals of an embodiment include signals having a second potential difference applied between a source and a drain of the transistor.

The second potential difference of an embodiment is configured to refresh a logic high data state in the transistor. The second potential difference of an embodiment is greater than a threshold at which current flows in the body region of the transistor. The second write control signals of an embodiment include signals having a third potential difference applied between a source and a drain of the transistor. The third potential difference of an embodiment is configured to refresh a logic low data state in the transistor. The third potential difference of an embodiment is less than a threshold at which current flows in the body region of the transistor.

The first write control signals of an embodiment include signals having a second potential difference applied between a source and a drain of the transistor. The second write control signals of an embodiment include signals having a third potential difference applied between the source and the drain. The second potential difference of an embodiment is greater than the third potential difference.

The body region of the transistor of an embodiment functions as an inherent bipolar transistor.

The integrated circuit device of an embodiment includes data sense circuitry coupled to the memory cell. The data sense circuitry of an embodiment includes a read-word line coupled to the gate and a read-bit output coupled to the source region or the drain region.

The body region of an embodiment stores a data bit in the form of a charge accumulated in the body region. In response to the read control signals, the transistor of an embodiment delivers the data bit onto the read-bit line by discharging the body region in response to a shifting voltage level on the read-word line. The shifting voltage level on the read-word line of an embodiment provides a gate-to-source voltage sufficient to cause read-bit line charging or lack of charging depending on data state. The discharging of an embodiment provides a read current at the read-bit line that is proportional to the current gain of the transistor multiplied by the charge.

The data sense circuitry of an embodiment determines a data state of the memory cell at least substantially based on the read current.

The transistor of an embodiment delivers the data bit onto the read-bit line by discharging the body region in response to a shifting voltage level on a read-source line coupled to the source region or the drain region.

The gate of the transistor of an embodiment is disposed over a first portion of the body region.

The source region of the transistor of an embodiment adjoins a second portion of the body region that is adjacent the first portion and separates the source region from the first portion.

The drain region of the transistor of an embodiment adjoins a third portion of the body region that is adjacent the first portion and separates the drain region from the first portion.

The integrated circuit device of an embodiment includes a first voltage coupled to the gate. The first voltage of an embodiment may cause minority carriers to accumulate in the first portion of the body region.

The minority carriers accumulate in the transistor of an embodiment at a surface region of the first portion of body region that is juxtaposed or near a gate dielectric which is disposed between the gate and the first portion of the body region.

A region of the transistor of an embodiment that includes the minority carriers is disconnected from the source region by the second portion of the body region.

A region of the transistor of an embodiment that includes the minority carriers is disconnected from the drain region by the third portion of the body region.

The integrated circuit device of an embodiment includes a first potential difference coupled between the source and the drain. The first potential difference of an embodiment is greater than a threshold above which bipolar current is generated in the body. The first potential difference of an embodiment generates bipolar current in the body region as a result of impact ionization due to the presence of minority carriers in the body region.

The integrated circuit device of an embodiment includes a first potential difference coupled between the source and the drain. The first potential difference of an embodiment is less than a threshold above which bipolar current is generated in the body.

The integrated circuit device of an embodiment includes a second voltage coupled to the gate after and instead of the first voltage. The second voltage of an embodiment is greater than a threshold which causes an accumulation of minority carriers in the first portion of the body region. The minority carriers of the transistor of an embodiment result in the first data state which is representative of a first charge in the body region.

The integrated circuit device of an embodiment includes a second voltage coupled to the gate after and instead of the first voltage. The second voltage of an embodiment is less than a threshold which causes an accumulation of minority carriers in the first portion of the body region.

One or more of the source region and the drain region of the transistor of an embodiment include a doped region shaped so that a farthermost boundary of the doped region is separated from a portion of the body region underlying the gate.

The body region of the transistor of an embodiment includes a first type of semiconductor material and the source region and drain region include a second type of semiconductor material.

The source region of the transistor of an embodiment includes a lightly doped region.

The source region of the transistor of an embodiment includes a highly doped region.

The source region of the transistor of an embodiment includes a lightly doped region and a highly doped region.

The drain region of the transistor of an embodiment includes a lightly doped region.

The drain region of the transistor of an embodiment includes a highly doped region.

The drain region of the transistor of an embodiment includes a lightly doped region and a highly doped region.

Aspects of the present inventions described herein, and/or embodiments thereof, may include an integrated circuit device. The IC device of an embodiment includes a memory cell including a transistor, the transistor comprising a gate, a body region configured to be electrically floating, and a source region and a drain region adjacent the body region. The IC device of an embodiment includes refresh circuitry coupled to the memory cell. The refresh circuitry of an embodiment is configured to refresh data of the transistor by sequentially applying to the transistor, during a single clock cycle, read control signals and one of first write control signals and second write control signals.

Aspects of the present inventions described herein, and/or embodiments thereof, may include an integrated circuit device. The IC device of an embodiment comprises a memory cell consisting essentially of one transistor. The transistor of an embodiment comprises a gate, an electrically floating body region, and a source region and a drain region adjacent the body region. The IC device of an embodiment comprises refresh circuitry coupled to the memory cell. The refresh circuitry of an embodiment is configured to refresh data of the transistor by applying to the transistor, during a single clock cycle, read control signals followed by write control signals.

The read control signals of an embodiment include a first gate signal applied to a gate of the transistor and a first potential difference applied between a source and a drain of the transistor. The first gate signal of an embodiment includes a voltage approximately in a range of −1.2 volts to zero (0) volts.

The write control signals of an embodiment comprise one of first write control signals and second write control signals. The refresh circuitry of an embodiment is configured to apply the first write control signals to the transistor when detecting a logic high data state in the transistor in response to the applying of the read control signals. The refresh circuitry of an embodiment is configured to apply the second write control signals to the transistor when detecting a logic low data state in the transistor in response to the applying of the read control signals.

The first write control signals and second write control signals of an embodiment include a second gate signal applied to the gate. The second gate signal of an embodiment includes a voltage approximately in a range of zero (0) volts to one (1) volt.

The first write control signals of an embodiment include signals having a second potential difference applied between a source and a drain of the transistor. The second potential difference of an embodiment is configured to refresh a logic high data state in the transistor. The second potential difference of an embodiment is greater than a threshold at which current flows in the body region of the transistor.

The second write control signals of an embodiment include signals having a third potential difference applied between a source and a drain of the transistor. The third potential difference of an embodiment is configured to refresh a logic low data state in the transistor. The third potential difference of an embodiment is less than a threshold at which current flows in the body region of the transistor.

The first write control signals of an embodiment include signals having a second potential difference applied between a source and a drain of the transistor. The second write control signals of an embodiment include signals having a third potential difference applied between the source and the drain, wherein the second potential difference is greater than the third potential difference.

Aspects of the present inventions described herein, and/or embodiments thereof, may include a method for refreshing a memory cell, the memory cell comprising a transistor configured to include a floating body. The method of an embodiment comprises sequentially applying read control signals and refresh control signals to the transistor during a single clock cycle. The refresh control signals of an embodiment comprise one of first write control signals to refresh a first data state and second write control signals to refresh a second data state.

The method of an embodiment comprises selecting one of the first and the second write control signals in response to a data state detected in the transistor during the applying of the read control signals.

The applying of the read control signals of an embodiment comprises applying a first gate signal to a gate of the transistor. The applying of the read control signals of an embodiment comprises applying a source signal to a source of the transistor and a drain signal to a drain of the transistor. A first potential difference is applied between the source and the drain of the transistor of an embodiment.

The applying of the refresh control signals of an embodiment comprises applying a second gate signal to a gate of the transistor.

The method of an embodiment comprises detecting a logic high data state in the floating body in response to the applying of the read control signals. The first write control signals of an embodiment are configured to refresh a logic high data state in the transistor. The applying of the first write control signals of an embodiment comprises generating a second potential difference between a source and a drain of the transistor. The second potential difference of an embodiment is greater than a threshold at which current flows in the transistor.

The method of an embodiment comprises detecting a logic low data state in the transistor. The second write control signals of an embodiment are configured to refresh a logic low data state in the transistor. The applying of the second write control signals of an embodiment comprises generating a third potential difference between a source and a drain of the transistor. The third potential difference of an embodiment is less than a threshold at which current flows in the transistor.

Aspects of the present inventions described herein, and/or embodiments thereof, may include a method for refreshing a memory cell. The method for refreshing a memory cell of an embodiment comprises applying read control signals to a transistor during a clock cycle. The read control signals of an embodiment include a first gate signal applied to a gate of the transistor and a first potential difference applied between a source and a drain of the transistor. A body region of the transistor of an embodiment is configured to be electrically floating. The method for refreshing a memory cell of an embodiment comprises applying write control signals to the transistor during the clock cycle and following the read control signals. The write control signals of an embodiment include a second gate signal applied to the gate and a second or third potential difference applied between a source and a drain of the transistor depending on data state detected in the transistor during the applying of the read control signals.

The method for refreshing a memory cell of an embodiment comprises detecting a logic high data state in the body region in response to the read control signals. The second potential difference of an embodiment is configured to refresh the logic high data state. The second potential difference of an embodiment is greater than a threshold at which current flows in the body region.

The method for refreshing a memory cell of an embodiment comprises detecting a logic low data state in the body region. The third potential difference of an embodiment is configured to refresh the logic low data state. The third potential difference of an embodiment is less than a threshold at which current flows in the body region.

As mentioned above, each of the aspects of the present inventions, and/or embodiments thereof, may be employed alone or in combination with one or more of such aspects and/or embodiments. For the sake of brevity, those permutations and combinations will not be discussed separately herein. As such, the present inventions are neither limited to any single aspect (nor embodiment thereof), nor to any combinations and/or permutations of such aspects and/or embodiments.

Moreover, the above embodiments of the present inventions are merely example embodiments. They are not intended to be exhaustive or to limit the inventions to the precise forms, techniques, materials and/or configurations disclosed. Many modifications and variations are possible in light of the above teaching. It is to be understood that other embodiments may be utilized and operational changes may be made without departing from the scope of the present inventions. As such, the foregoing description of the example embodiments of the inventions has been presented for the purposes of illustration and description. Many modifications and variations are possible in light of the above teaching. It is intended that the scope of the inventions not be limited solely to the description above.

The invention claimed is:

1. An integrated circuit device comprising:
a memory cell including a transistor having a body region configured to be electrically floating; and
data write and sense circuitry coupled to the memory cell, the data write and sense circuitry configured to refresh data of the transistor by sequentially applying read control signals and one of first write control signals and second write control signals to the transistor during a single clock cycle, wherein one of the first write control signals and the second write control signals are applied to the transistor immediately following the application of the read control signals depending upon a data state detected in the transistor as a result of the application of the read control signals.

2. The integrated circuit device of claim 1, wherein the read control signals perform a read operation on the transistor during a first portion of the single clock cycle.

3. The integrated circuit device of claim 2, wherein the first write control signals perform a first write operation on the transistor during a second portion of the single clock cycle, wherein the first write operation comprises writing a logic high data state to the transistor if a logic high data state is detected in the transistor as a result of the application of the read control signals.

4. The integrated circuit device of claim 3, wherein the second write control signals perform a second write operation on the transistor during a second portion of the single clock cycle, wherein the second write operation comprises writing a logic low data state to the transistor if a logic low data state is detected in the transistor as a result of the application of the read control signals.

5. The integrated circuit device of claim 1, wherein the read control signals include a first gate signal applied to a gate of the transistor and a first potential difference applied between a source region and a drain region of the transistor.

6. The integrated circuit device of claim 5, wherein the first write control signals and the second write control signals include a second gate signal applied to the gate of the transistor.

7. The integrated circuit device of claim 6, wherein the first write control signals include signals having a second potential difference applied between the source region and the drain region of the transistor.

8. The integrated circuit device of claim 7, wherein the second potential difference is configured to refresh a logic high data state in the transistor.

9. The integrated circuit device of claim 8, wherein the second potential difference is greater than a threshold at which current flows in the body region of the transistor.

10. The integrated circuit device of claim 6, wherein the second write control signals include signals having a third potential difference applied between the source region and the drain region of the transistor.

11. The integrated circuit device of claim 10, wherein the third potential difference is configured to refresh a logic low data state in the transistor.

12. The integrated circuit device of claim 11, wherein the third potential difference is less than a threshold at which current flows in the body region of the transistor.

13. The integrated circuit device of claim 6, wherein the first write control signals include signals having a second potential difference applied between the source region and the drain region of the transistor, wherein the second write control signals include signals having a third potential difference applied between the source region and the drain region, wherein the second potential difference is greater than the third potential difference.

14. The integrated circuit device of claim 1, wherein the body region functions as an inherent bipolar transistor.

15. The integrated circuit device of claim 1, wherein the data write and sense circuitry comprises a read-word line coupled to the gate and a read-bit output coupled to the source region or the drain region.

16. The integrated circuit device of claim 15, wherein the body region stores data in the form of a charge accumulated in the body region.

17. The integrated circuit device of claim 16, wherein, in response to the read control signals, the transistor imparts the data onto the read-bit line by discharging the body region in response to a shifting voltage level on the read-word line.

18. The integrated circuit device of claim 17, wherein the shifting voltage level on the read-word line provides a gate-to-source voltage sufficient to cause read-bit line charging or lack of charging depending on data state.

19. The integrated circuit device of claim 18, wherein the discharging provides a read current on the read-bit line that is proportional to a current gain of the transistor multiplied by the charge.

20. The integrated circuit device of claim 19, wherein the data write and sense circuitry determines a data state of the memory cell at least substantially based on the read current.

21. The integrated circuit device of claim 17, wherein the transistor further imparts the data onto the read-bit line by discharging the body region in response to a shifting voltage level on a read-source line coupled to the source region or the drain region.

22. The integrated circuit device of claim 5, wherein the gate is disposed over a first portion of the body region.

23. The integrated circuit device of claim 22, wherein the source region adjoins a second portion of the body region that is adjacent the first portion and separates the source region from the first portion.

24. The integrated circuit device of claim 23, wherein the drain region adjoins a third portion of the body region that is adjacent the first portion and separates the drain region from the first portion.

25. The integrated circuit device of claim 5, wherein one or more of the source region and the drain region include a doped region shaped so that a farthermost boundary of the doped region is separated from a portion of the body region underlying the gate.

26. The integrated circuit device of claim 5, wherein the body region includes a first type of semiconductor material and the source region and drain region include a second type of semiconductor material.

27. The integrated circuit device of claim 26, wherein the source region includes a lightly doped region.

28. The integrated circuit device of claim 26, wherein the source region includes a highly doped region.

29. The integrated circuit device of claim 26, wherein the source region includes a lightly doped region and a highly doped region.

30. The integrated circuit device of claim 26, wherein the drain region includes a lightly doped region.

31. The integrated circuit device of claim 26, wherein the drain region includes a highly doped region.

32. The integrated circuit device of claim 26, wherein the drain region includes a lightly doped region and a highly doped region.

33. An integrated circuit device comprising:
a memory cell including a transistor having a body region configured to be electrically floating; and
data write and sense circuitry coupled to the memory cell, the data write and sense circuitry configured to refresh data of the transistor by sequentially applying read control signals and one of first write control signals and second write control signals to the transistor during a single clock cycle, wherein the first write control signals or the second write control signals are applied to the transistor immediately following the application of the read control signals, wherein voltage levels of the read control signals and the first and the second write control signals are approximately equivalent.

34. An integrated circuit device comprising:
a memory cell including a transistor having an electrically floating body region; and
data write and sense circuitry coupled to the memory cell, the data write and sense circuitry configured to refresh data of the transistor by sequentially applying read control signals followed by write control signals to the transistor during a single clock cycle, wherein the write control signals are applied to the transistor immediately following the application of the read control signals depending upon a data state detected in the transistor as a result of the application of the read control signals.

* * * * *